United States Patent
Yamamoto

(10) Patent No.: US 9,767,724 B2
(45) Date of Patent: Sep. 19, 2017

(54) DISPLAY PANEL, DISPLAY UNIT, AND ELECTRONIC APPARATUS

(71) Applicant: JOLED Inc., Tokyo (JP)

(72) Inventor: Tetsuro Yamamoto, Tokyo (JP)

(73) Assignee: JOLED Inc., Tokyo (JP)

( * ) Notice: Subject to any disclaimer, the term of this patent is extended or adjusted under 35 U.S.C. 154(b) by 0 days.

(21) Appl. No.: 15/348,863

(22) Filed: Nov. 10, 2016

(65) Prior Publication Data

US 2017/0140693 A1    May 18, 2017

(30) Foreign Application Priority Data

Nov. 13, 2015  (JP) .................................. 2015-222717

(51) Int. Cl.
| | |
|---|---|
| *H01L 27/32* | (2006.01) |
| *G09G 3/20* | (2006.01) |
| *G09G 3/3233* | (2016.01) |
| *G09G 3/3266* | (2016.01) |

(52) U.S. Cl.
CPC ......... *G09G 3/2074* (2013.01); *G09G 3/3233* (2013.01); *G09G 3/3266* (2013.01); *H01L 27/3211* (2013.01); *H01L 27/3272* (2013.01); *H01L 27/3276* (2013.01); *G09G 2300/0809* (2013.01); *H01L 27/3213* (2013.01)

(58) Field of Classification Search
CPC combination set(s) only.
See application file for complete search history.

(56) References Cited

U.S. PATENT DOCUMENTS

| | | | |
|---|---|---|---|
| 6,771,028 B1 * | 8/2004 | Winters ............... | G09G 3/3233 315/169.1 |
| 2001/0030510 A1 * | 10/2001 | Amemiya ................ | H01J 11/36 313/582 |
| 2011/0181629 A1 | 7/2011 | Minami et al. | |
| 2016/0035284 A1 * | 2/2016 | Jung ....................... | G06F 1/163 345/206 |
| 2016/0146435 A1 * | 5/2016 | Son .......................... | F21K 9/00 362/84 |

FOREIGN PATENT DOCUMENTS

JP     2011-154287 A     8/2011

* cited by examiner

*Primary Examiner* — Mamadou Diallo
(74) *Attorney, Agent, or Firm* — Michael Best & Friedrich LLP

(57) ABSTRACT

A display panel includes a plurality of pixels and a plurality of power lines. The plurality of pixels are disposed in a matrix and include respective light-emitting devices and respective pixel circuits. The pixel circuits are disposed at unequal intervals in a column direction. The light-emitting devices are provided to allow light-emitting regions of the respective light-emitting devices to have an equal interval in the column direction. The plurality of power lines are extended in a row direction and each supply a current flowing into the light-emitting device. Each one of the plurality of power lines is disposed for a plurality of pixel rows. A spacing between the pixel circuits in the column direction is relatively large at a portion facing one of the power lines. A spacing between the pixel circuits in the column direction is relatively small at a portion facing wiring other than the power lines.

8 Claims, 17 Drawing Sheets

DISPLAY PANEL, DISPLAY UNIT, AND ELECTRONIC APPARATUS

CROSS REFERENCE TO RELATED APPLICATIONS

The present application claims priority from Japanese Patent Application No. 2015-222717 filed on Nov. 13, 2015, the entire contents of which are hereby incorporated by reference.

BACKGROUND

The technology relates to a display panel, a display unit, and an electronic apparatus.

In the technical field of display units that perform image display, recently, a display unit employing, as a light-emitting device of a pixel, a current-driven optical device such as an organic electroluminescence (EL) device has been developed, and increasingly commercialized. The current-driven optical device has emission luminance which varies depending on a value of a flowing current. The organic EL device is a self-light-emitting device unlike a device such as a liquid crystal device. The display unit employing the organic EL device (organic EL display unit) therefore does not need a light source (backlight), thus enabling the organic EL display unit to be more lightweight and thinner, and to have higher luminance than a liquid crystal display unit that needs a light source. Further, the organic EL device has a very high response speed of about several micro seconds, thus preventing the occurrence of an afterimage during display of a motion picture. Hence, the organic EL display unit is expected to be a mainstream next-generation flat panel display.

The organic EL display unit is requested to have still higher definition which is also requested likewise for other display units. Under such circumstances, reduction in the number of power lines whose wiring widths are relatively large and sharing a single power line by a plurality of pixel rows are considered. For example, reference is made to Japanese Unexamined Patent Application Publication No. 2011-154287.

SUMMARY

However, when a gap that occurs as a result of the reduction of the power lines is eliminated by narrowing a spacing between pixels, pixel pitches are not equal to one another on a plane. In general, when the pixel pitches are not equal to one another on a plane, definition at the time when an image is displayed is determined by a portion having the largest spacing. Accordingly, it is disadvantageous that the definition does not change considerably from definition before reducing the number of power lines.

It is desirable to provide a high-definition display panel, and a display unit and an electronic apparatus each including the high-definition display panel.

A display panel according to an embodiment of the technology includes a plurality of pixels and a plurality of power lines. The plurality of pixels are disposed in a matrix and include respective light-emitting devices and respective pixel circuits. The pixel circuits are disposed at unequal intervals in a column direction. The light-emitting devices are provided to allow light-emitting regions of the respective light-emitting devices to have an equal interval in the column direction. The plurality of power lines are extended in a row direction and each supply a current flowing into the light-emitting device. Each one of the plurality of power lines is disposed for a plurality of pixel rows. A spacing between the pixel circuits in the column direction is relatively large at a portion facing one of the power lines, and a spacing between the pixel circuits in the column direction is relatively small at a portion facing wiring other than the power lines.

A display unit according to an embodiment of the technology is provided with a display panel and a drive circuit that drives the display panel. The display panel includes a plurality of pixels and a plurality of power lines. The plurality of pixels are disposed in a matrix and include respective light-emitting devices and respective pixel circuits. The pixel circuits are disposed at unequal intervals in a column direction. The light-emitting devices are provided to allow light-emitting regions of the respective light-emitting devices to have an equal interval in the column direction. The plurality of power lines are extended in a row direction and each supply a current flowing into the light-emitting device. Each one of the plurality of power lines is disposed for a plurality of pixel rows. A spacing between the pixel circuits in the column direction is relatively large at a portion facing one of the power lines, and a spacing between the pixel circuits in the column direction is relatively small at a portion facing wiring other than the power lines.

An electronic apparatus according to an embodiment of the technology is provided with the display unit. The display unit is provided with a display panel and a drive circuit that drives the display panel. The display panel includes a plurality of pixels and a plurality of power lines. The plurality of pixels are disposed in a matrix and include respective light-emitting devices and respective pixel circuits. The pixel circuits are disposed at unequal intervals in a column direction. The light-emitting devices are provided to allow light-emitting regions of the respective light-emitting devices to have an equal interval in the column direction. The plurality of power lines are extended in a row direction and each supply a current flowing into the light-emitting device. Each one of the plurality of power lines is disposed for a plurality of pixel rows. A spacing between the pixel circuits in the column direction is relatively large at a portion facing one of the power lines, and a spacing between the pixel circuits in the column direction is relatively small at a portion facing wiring other than the power lines.

BRIEF DESCRIPTION OF THE DRAWINGS

The accompanying drawings are included to provide a further understanding of the disclosure, and are incorporated in and constitute a part of this specification. The drawings illustrate example embodiments and, together with the specification, serve to explain the principles of the technology.

DETAILED DESCRIPTION

Some example embodiments of the technology are described below in detail, in the following order, with reference to the accompanying drawings.

1. Example Embodiment (display unit)
2. Modification Example (display unit)
3. Application Example (electronic apparatus)

1. Example Embodiment

[Configuration]

Figure 1:
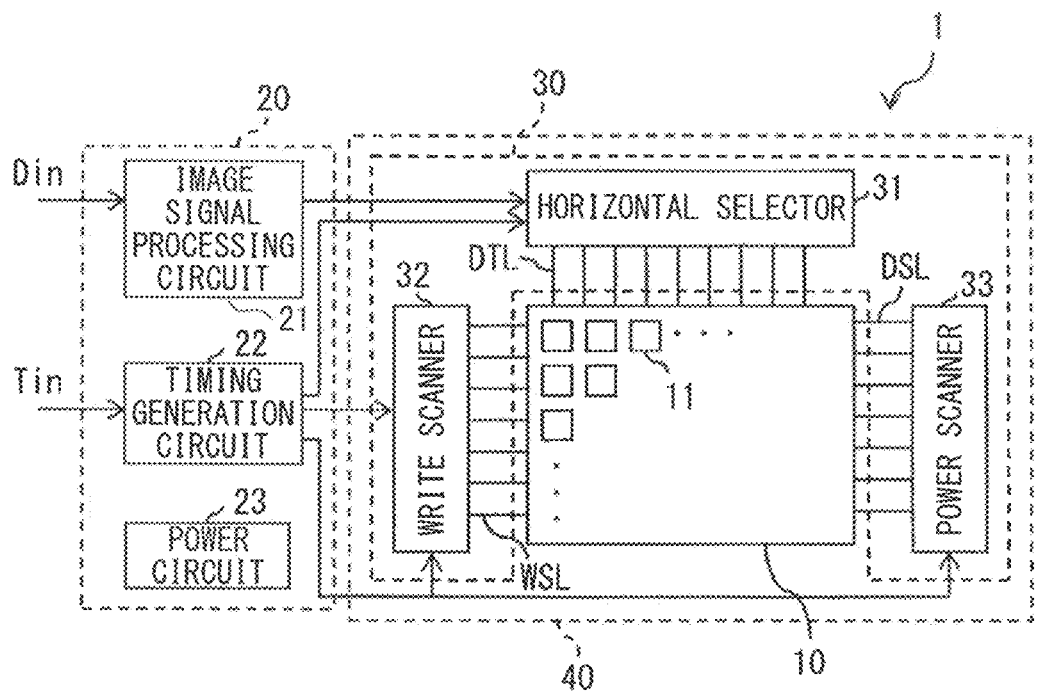
FIG. 1 is a schematic configuration diagram of a display unit according to an example embodiment of the technology.

FIG. 1 illustrates a schematic configuration of a display unit 1 according to an example embodiment of the technology. The display unit 1 may include a pixel array section 10, a controller 20, and a driver 30, for example. The display unit 1 may be provided with a display panel 40 including the pixel array section 10, for example. The driver 30 may be mounted on an outer edge part of the display panel 40. The pixel array section 10 includes a plurality of display pixels 11 disposed in a matrix. The controller 20 and the driver 30 may drive each of the display pixels 11 on the basis of an image signal Din and a synchronizing signal Tin which are supplied from the outside.

[Pixel Array Section 10]

The controller 20 and the driver 30 may active-matrix-drive each of the display pixels 11 to allow the pixel array section 10 to display an image based on the image signal Din and the synchronizing signal Tin which are supplied from the outside. The pixel array section 10 may include a plurality of scanning lines WSL and a plurality of power lines DSL both being extended in a row direction, a plurality of signal lines DTL being extended in a column direction, and the plurality of display pixels 11 each disposed for every location at which corresponding one of the scanning lines WSL and corresponding one of the signal lines DTL intersects with each other. The power line DSL may correspond to a specific but non-limiting example of the "power line" according to an embodiment of the technology.

The scanning line WSL may be used for selecting each of the display pixels 11, and may supply a selection pulse to each of the display pixels 11. The selection pulse may select each of the display pixels 11 for each predetermined unit (e.g., for each pixel row or each subpixel row). The signal line DTL may be used for supplying each of the display pixels 11 with a signal voltage Vsig in accordance with the image signal Din or an image signal Din2 (to be described later), and may supply each of the display pixels 11 with a data pulse including the signal voltage Vsig. The power line DSL may supply a current that flows into each of the display pixels 11 (organic EL device 14 to be described later).

Figure 2:
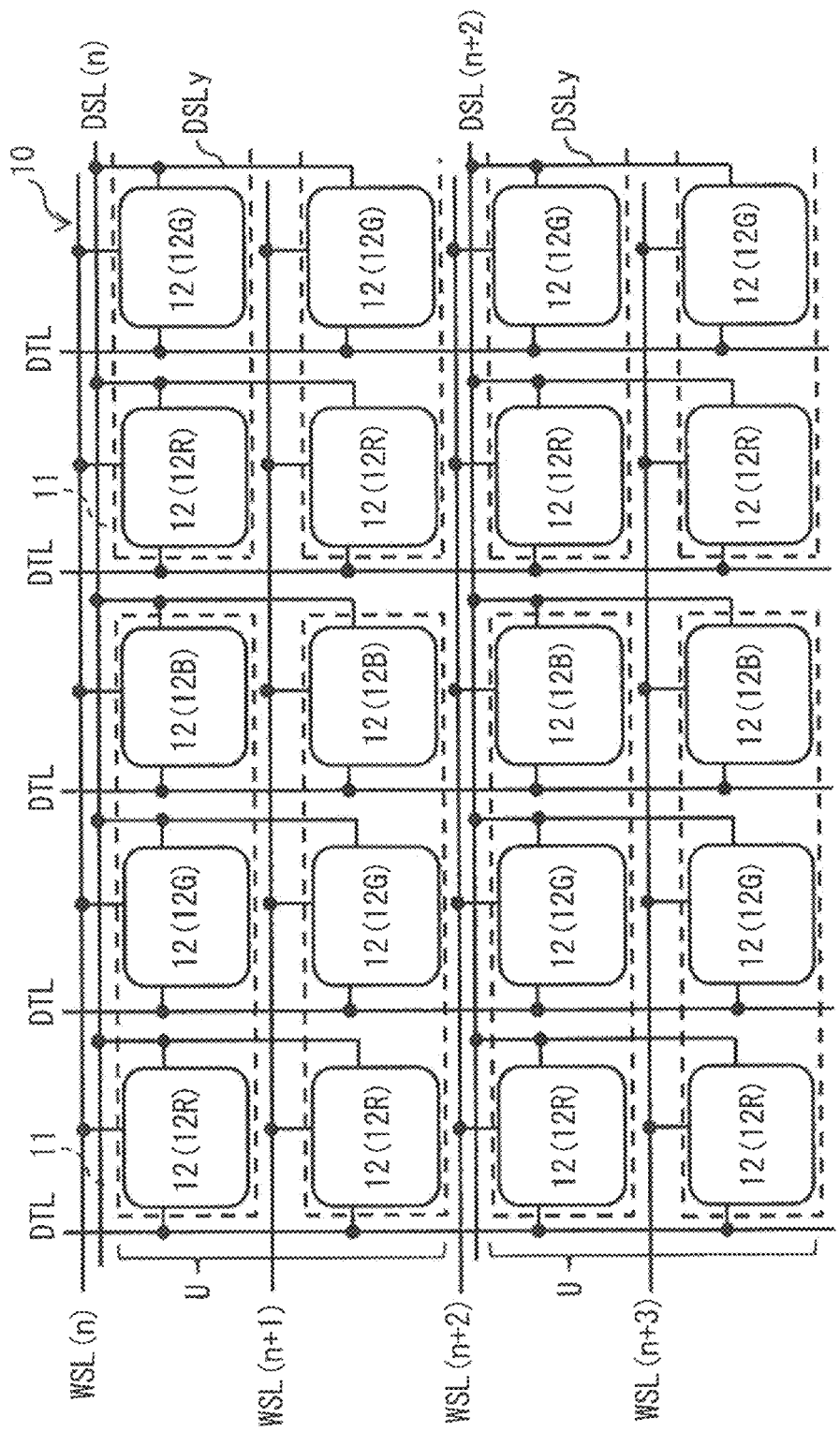
FIG. 2 is a diagram illustrating an example of a circuit configuration of a pixel array section in FIG. 1.

FIG. 2 illustrates an example of a circuit configuration of each of the display pixels 11 included in the pixel array section 10. Each of the display pixels 11 may include a plurality of subpixels 12. The subpixel 12 or the display pixel 11 may correspond to a specific but non-limiting example of the "pixel" according to an embodiment of the technology. Further, each of the subpixels 12 may correspond to a specific but non-limiting example of "each of a plurality of subpixels included in a display pixel configured by the plurality of subpixels disposed side by side in the row direction" according to an embodiment of the technology.

In each of the display pixels 11, the plurality of subpixels 12 may be disposed side by side in a line. Each of the display pixels 11 may include three subpixels 12, for example. Each of the display pixels 11 may include subpixels 12R, 12G and 12B, as illustrated in FIG. 2, for example. The subpixel 12R may be a pixel that emits red light. The subpixel 12G may be a pixel that emits green light. The subpixel 12B may be a pixel that emits blue light. It is to be noted that each of the display pixels 11 may include four subpixels 12. In this case, each of the display pixels 11 may include subpixels 12R, 12G, 12B, and 12W, for example. The subpixel 12W may be a pixel that emits white light.

One scanning line WSL may be assigned to each pixel row (or subpixel row). Each of the scanning lines WSL may be coupled to each of the subpixels 12 included in the assigned subpixel row. Each one of the plurality of scanning lines WSL may be disposed for each spacing between display pixels 11 (or subpixels 12) adjacent to each other in the column direction. It is to be noted that, in FIG. 2, the scanning line WSL corresponding to the n-th pixel row (or subpixel row) is expressed as a scanning line WSL (n). Likewise, the scanning line WSL corresponding to the n+1-th pixel row (or subpixel row) is expressed as a scanning line WSL (n+1); the scanning line WSL corresponding to the n+2-th pixel row (or subpixel row) is expressed as a scanning line WSL (n+2); and the scanning line WSL corresponding to the n+3-th pixel row (or subpixel row) is expressed as a scanning line WSL (n+3).

One power line DSL may be assigned to a plurality of pixel rows (or a plurality of subpixels rows) adjacent to each other in the column direction. That is, each one of the plurality of power lines DSL may be disposed for the plurality of pixel rows (or the plurality of subpixel rows). Each of the power lines DSL may be coupled to each of the subpixels 12 included in the assigned plurality of subpixel rows. Each of the power lines DSL may include a plurality of branch lines DSLy, each one of which is assigned to each subpixel column. Each of the branch lines DSLy is coupled to the plurality of subpixels 12 arranged in the column direction. When a band-shaped region including the plurality of subpixel rows assigned to each power line DSL is expressed as a unit U, each one of the plurality of power lines DSL is disposed for each spacing between the two units U adjacent to each other. It is to be noted that, in FIG. 2, the power line DSL corresponding to the n-th and the n+1-th subpixel rows is expressed as a power line DSL (n). Likewise, the power lines DSL corresponding to the n+2-th and the n+3-th subpixel rows is expressed as a power line DSL (n+2).

One signal line DTL may be assigned to each subpixel column. Each of the signal lines DTL may be coupled to each of the subpixels 12 included in the assigned subpixel column.

Figure 3:
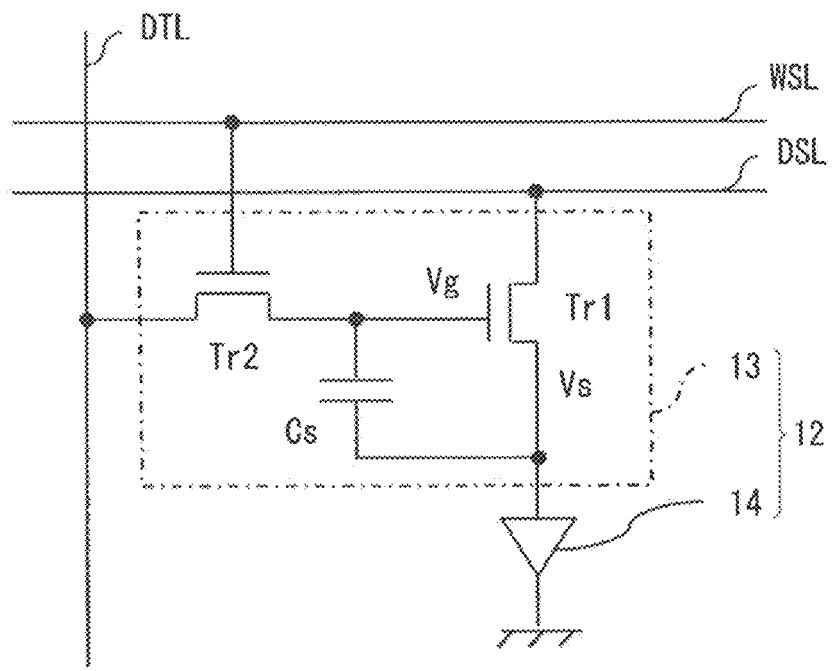
FIG. 3 is a diagram illustrating an example of a circuit configuration of each of subpixels.
Figure 4:
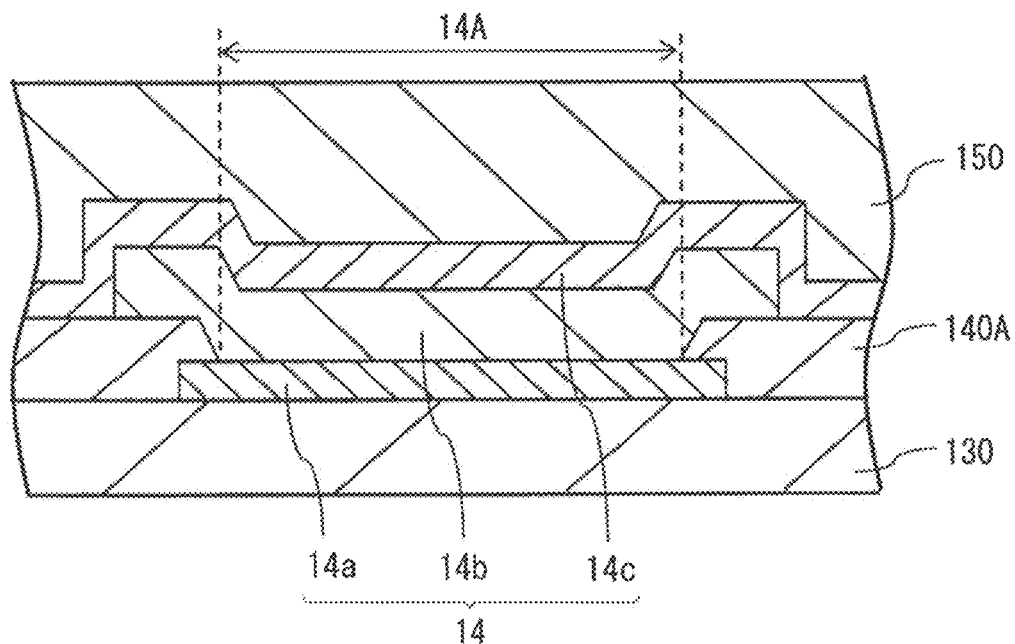
FIG. 4 is a diagram illustrating an example of a cross-sectional configuration of an organic EL device in FIG. 2

FIG. 3 illustrates an example of a circuit configuration of each of the subpixels 12. Each of the subpixels 12 may include a pixel circuit 13 and the organic EL device 14, for example. The pixel circuit 13 may correspond to a specific but non-limiting example of the "pixel circuit" according to an embodiment of the technology. The organic EL device 14 may correspond to a specific but non-limiting example of the "light-emitting device" according to an embodiment of the technology. The organic EL device 14 may have a configuration in which an anode-side electrode layer 14a, an organic layer 14b, and a cathode-side electrode layer 14c are layered in this order as illustrated in FIG. 4, for example. The electrode layer 14a may be provided on an insulating layer 130. A part, which is exposed to the inside of an opening of an insulating layer 140A, out of an upper surface of the electrode layer 14a may be in contact with the organic layer 14b. The electrode layer 14c may be in contact with the entire upper surface of the organic layer 14b. A part, which faces the opening of the insulating layer 140A, out of the organic layer 14b may be a light-emitting region 14A in the organic EL device 14. The organic EL device 14 may have a device capacitance.

The pixel circuit 13 may perform emission control of the organic EL device 14. The emission control may include emission control and extinction control. The pixel circuit 13 may have a function of holding a voltage written into each of the display pixels 11 by means of write scanning to be described later. The pixel circuit 13 may include a drive transistor Tr1, a write transistor Tr2, and a holding capacitor Cs, for example.

The write transistor Tr2 may control application of the signal voltage Vsig corresponding to the image signal Din to a gate of the drive transistor Tr1. More specifically, the write transistor Tr2 may sample a voltage of the signal line DTL, and may write the voltage obtained by the sampling into the gate of the drive transistor Tr1. The drive transistor Tr1 may be coupled in series to the organic EL device 14. The drive transistor Tr1 may drive the organic EL device 14. The drive transistor Tr1 may control a current flowing into the organic EL device 14 depending on the magnitude of the voltage sampled by the write transistor Tr2. The holding capacitor Cs may hold a predetermined voltage Vgs between the gate and a source of the drive transistor Tr1. Hereinafter, the term "gate-source voltage Vgs" refers to a gate-source voltage Vgs of the drive transistor Tr1, unless otherwise stated specifically. The holding capacitor Cs may have a role of holding the gate-source voltage Vgs of the drive transistor Tr1 to be constant. It is to be noted that the pixel circuit 13 may have a circuit configuration in which various capacitors or transistors are added to the foregoing circuit including two transistors (Tr) and one capacitor (C) (2Tr1C), or may have a circuit configuration different from the circuit configuration of the 2Tr1C.

The drive transistor Tr1 and the write transistor Tr2 may each include n-channel MOS thin film transistor (TFT), for example. It is to be noted that these transistors may each include p-channel MOS TFT. The following description is given on the assumption that these transistors are of enhancement type. However, these transistors may be of depression type.

Each of the signal lines DTL may be coupled to an output end of an horizontal selector 31 to be described later and to a source or a drain of the write transistor Tr2. Each of the scanning lines WSL may be coupled to an output end of a write scanner 32 to be described later and to a gate of the write transistor Tr2. Each of the power lines DSL may be coupled to an output end of a power supply (power circuit 23 to be described later) that outputs a fixed voltage and to the source or the drain of the drive transistor Tr1.

The gate of the write transistor Tr2 may be coupled to the scanning line WSL. The source or the drain of the write transistor Tr2 may be coupled to the signal line DTL. A terminal, which is not coupled to the signal line DTL, of the source and the drain of the write transistor Tr2 may be coupled to the gate of the drive transistor Tr1. The source or the drain of the drive transistor Tr1 may be coupled to the power line DSL. A terminal, which is not coupled to the power line DSL, of the source and the drain of the drive transistor Tr1 may be coupled to an anode of the organic EL device 14. A first end of the holding capacitor Cs may be coupled to the gate of the drive transistor Tr1. A second end of the holding capacitor Cs may be coupled to a terminal on the side of the organic EL device 14, of the source and the drain of the drive transistor Tr1.

The driver 30 may include the horizontal selector 31, the write scanner 32, and a power scanner 33, for example.

The horizontal selector 31 may apply to each of the signal lines DTL the analog signal voltage Vsig supplied from an image signal processing circuit 21 to be described later in response to (in synchronization with) the supply of a control signal, for example. The horizontal selector 31 may be able to supply two types of voltages (Vofs and Vsig), for example. More specifically, the horizontal selector 31 may supply the two types of voltages (Vofs and Vsig) to the subpixel 12 selected by the write scanner 32 to be described later via the signal line DTL. The signal voltage Vsig has a voltage value corresponding to the image signal Din. The fixed voltage Vofs may be a constant voltage irrelevant to the image signal Din. The minimum voltage of the signal voltage Vsig has a voltage value lower than that of the fixed voltage Vofs. The maximum voltage of the signal voltage Vsig has a voltage value higher than the fixed voltages Vofs. The horizontal selector 31 may supply a data pulse including the signal voltage Vsig to each of the signal lines DTL for each horizontal period. The horizontal selector 31 may supply each of the signal lines DTL with a pulse having two values of the signal voltage Vsig and the fixed voltage Vofs as the data pulse.

The write scanner 32 may scan the plurality of subpixels 12 for each predetermined unit. More specifically, the write scanner 32 may sequentially supply a selection pulse to each of the scanning lines WSL in one frame period. The write scanner 32 may select the plurality of scanning lines WSL through a predetermined sequence in response to (in synchronization with) the supply of the control signal, for example, to thereby execute operations such as preparation for threshold correction, threshold correction, writing of the signal voltage Vsig, mobility correction, and emission in a desired order.

As used herein, the term "preparation for threshold correction" refers to initializing a gate voltage Vg of the drive transistor Tr1 (more specifically, refers to changing the gate voltage Vg to Vofs). The term "gate voltage Vg" as used hereinafter refers to the gate voltage Vg of the drive transistor Tr1, unless otherwise stated specifically. The term "threshold correction" refers to a correction operation in which the gate-source voltage Vgs of the drive transistor Tr1 is made closer to a threshold voltage Vth of the drive transistor Tr1. The term "threshold voltage Vth" as used hereinafter refers to the threshold voltage Vth of the drive transistor Tr1, unless otherwise stated specifically. The term "writing of the signal voltage Vsig (signal writing)" refers to a writing operation in which the signal voltage Vsig is written into the gate of the drive transistor Tr1 via the write transistor Tr2. The term "mobility correction" refers to an operation in which a voltage held between the gate and the source of the drive transistor Tr1 (gate-source voltage Vgs) is corrected depending on the magnitude of mobility of the drive transistor Tr1. The signal writing and the mobility correction may be performed at different timings in some cases. According to the example embodiment of the disclosure, the write scanner 32 may supply one selection pulse to the scanning line WSL to thereby perform the signal writing and the mobility correction together (or continuously without interval).

The write scanner 32 may be able to supply two types of voltages (Von and Voff), for example. More specifically, the write scanner 32 may supply the display pixel 11 to be driven with the two types of voltages (Von and Voff) via the scanning line WSL to perform ON/OFF control of the write transistor Tr2. The ON-voltage Von has a value equal to or higher than that of an ON-voltage of the write transistor Tr2. The ON-voltage Von has a peak value of the selection pulse supplied from the write scanner 32 during periods such as "threshold correction preparation period," "threshold correction period," and "signal writing and mobility correction period," to be described later. The OFF-voltage Voff has a value lower than both the values of the ON-voltage of the write transistor Tr2 and of the ON-voltage Von.

The power scanner 33 may sequentially select the plurality of power lines DSL for each predetermined unit in response to (in synchronization with) the supply of the control signal, for example. The power scanner 33 may be able to supply two types of voltages (Vcc and Vss), for example. More specifically, the power scanner 33 may supply the two types of voltages (Vcc and Vss) to the display pixel 11 selected by the write scanner 32 via the power line DSL. A fixed voltage Vss has a voltage value lower than that of a voltage (Vel+Vcath) which is a sum of a threshold voltage Vel of the organic EL device 14 and a cathode voltage Vcath of the organic EL device 14. The fixed voltage Vcc has a voltage value higher than that of the voltage (Vel+Vcath).

[Controller 20]

Next, the controller 20 is described. The controller 20 may include the image signal processing circuit 21, a timing generation circuit 22, and the power circuit 23, for example. The image signal processing circuit 21 may perform a predetermined correction on the digital image signal Din supplied from the outside, for example, and may generate the signal voltage Vsig on the basis of the image signal obtained by the predetermined correction. The image signal processing circuit 21 may supply the generated signal voltage Vsig to the horizontal selector 31, for example. Non-limiting examples of the predetermined correction may include gamma correction and overdrive correction. The timing generation circuit 22 may control circuits in the driver 30 to operate in conjunction with one another. The timing generation circuit 22 may supply a control signal to each of the circuits in the driver 30 in response to (in synchronization with) the synchronizing signal Tin supplied from the outside, for example.

The power circuit 23 may generate various fixed voltages necessary for various circuits such as the horizontal selector 31, the write scanner 32, the power scanner 33, the image signal processing circuit 21, and the timing generation circuit 22, and may supply the generated various fixed voltages. The power circuit 23 may generate voltages Vss (=0 V) and Vcc (=20 V), for example, and may supply these voltages to the foregoing various circuits. The fixed voltage Vss has a voltage value lower than that of a voltage (Vel+Vcath) which is the sum of the threshold voltage Vel of the organic EL device 14 and the cathode voltage Vcath of the organic EL device 14. The fixed voltage Vcc is a voltage that has a voltage value higher than that of the voltage (Vel+Vcath).

Figure 5:
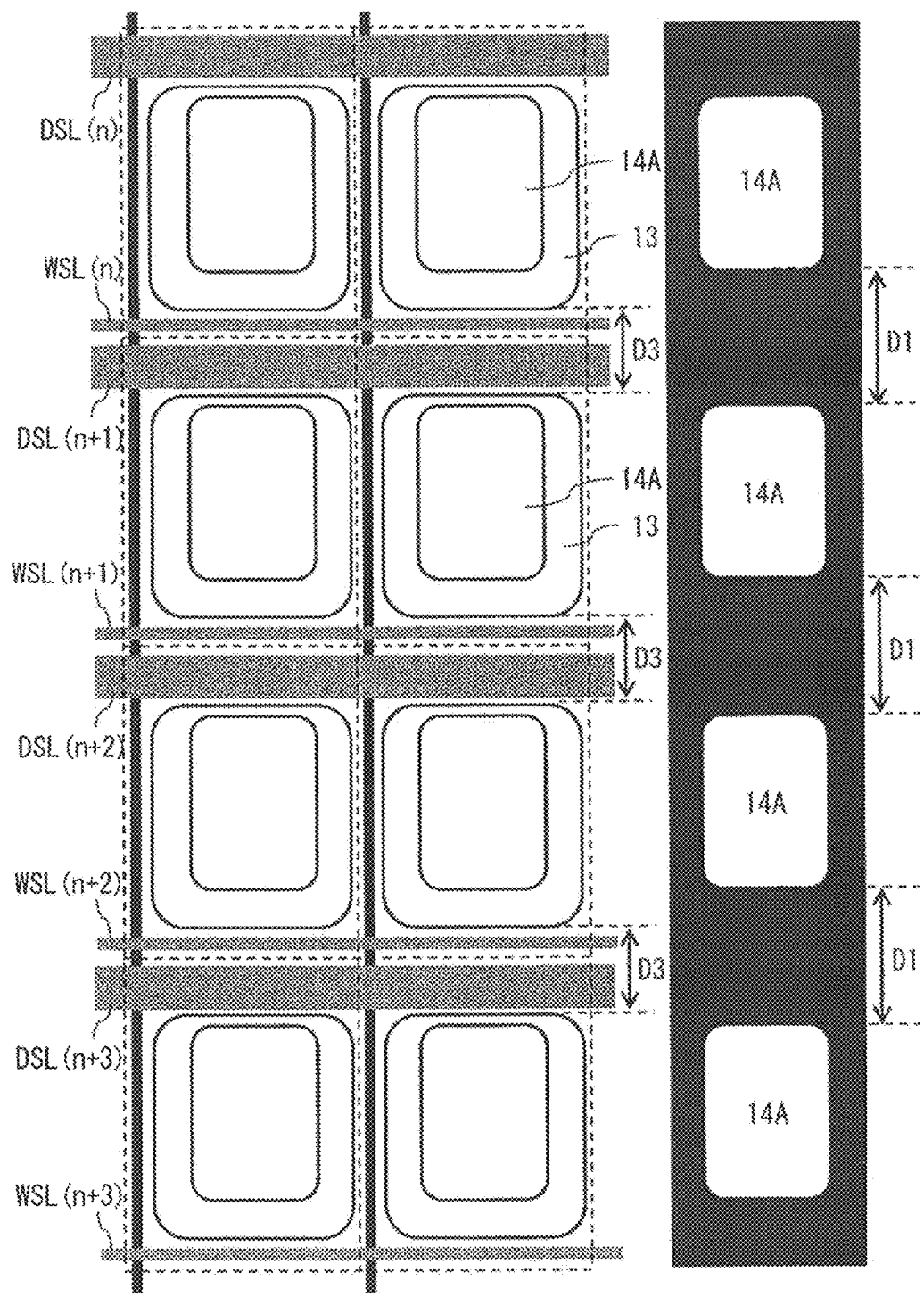
FIG. 5 is a diagram illustrating an example of a layout of a pixel array section according to a comparative example.

Next, the layout and the cross-sectional configuration of the pixel array section 10 are described in comparison with comparative examples. FIG. 5 illustrates an example of the layout of a pixel array section according to a comparative example. In the pixel array section according to the comparative example, each one of a plurality of power lines DSL is provided for each subpixel row. Further, each one of a plurality of scanning lines WSL is also provided for each subpixel row. Accordingly, a spacing D3 between two pixel circuits 13 adjacent to each other in the column direction is constant irrespective of its location. Along with the constant spacing D3, a spacing D1 between two light-emitting regions 14A adjacent to each other in the column direction is also constant irrespective of its location.

Figure 6:
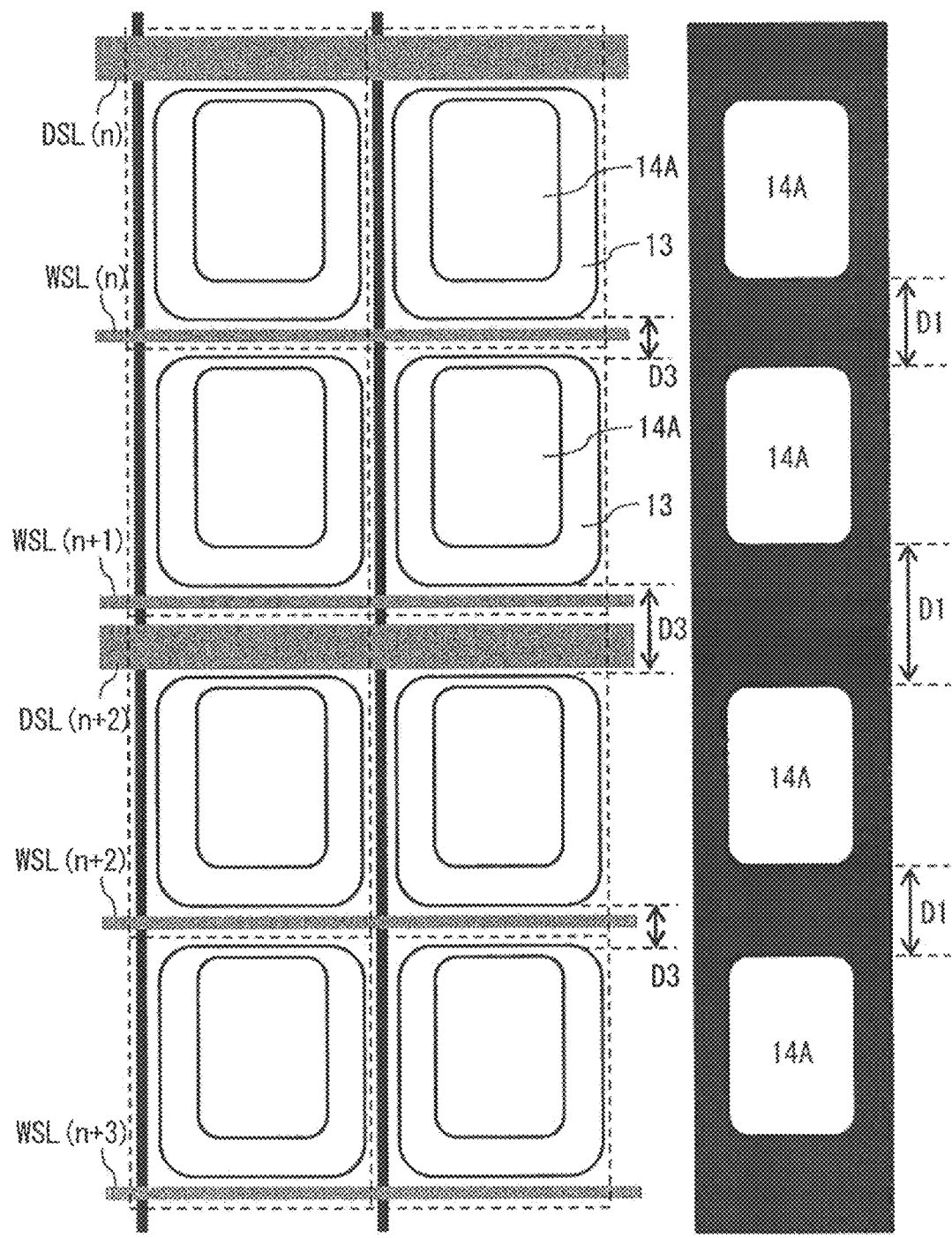
FIG. 6 is a diagram illustrating an example of a layout of a pixel array section according to a comparative example.

In the pixel array section in FIG. 5, reduction in the number of power lines DSL whose wiring widths are relatively large and sharing a single power line DSL by a plurality of pixel rows are considered, for example, as illustrated in FIG. 6, for achieving higher definition. However, when a gap that occurs as a result of omitting the power line DSL is eliminated by narrowing a spacing between pixels, the spacing D3 corresponding to the portion where the power line DSL is omitted becomes narrower than the spacing D3 corresponding to the portion where the power line DSL is present. Along with the narrowed spacing D3, the spacing D1 corresponding to the portion where the power line DSL is omitted becomes narrower than the spacing D1 corresponding to a portion where the power line DSL is present. Accordingly, the pixel pitches are not equal to one another on a plane. In general, when the pixel pitches are not equal to one another on a plane, definition at the time when an image is displayed is determined by the part having the largest pitch. Thus, in the pixel array section in FIG. 6, the definition does not change considerably from definition before reducing the number of the power lines DSL, despite the reduction in the number of the power lines DSL.

Figure 7:
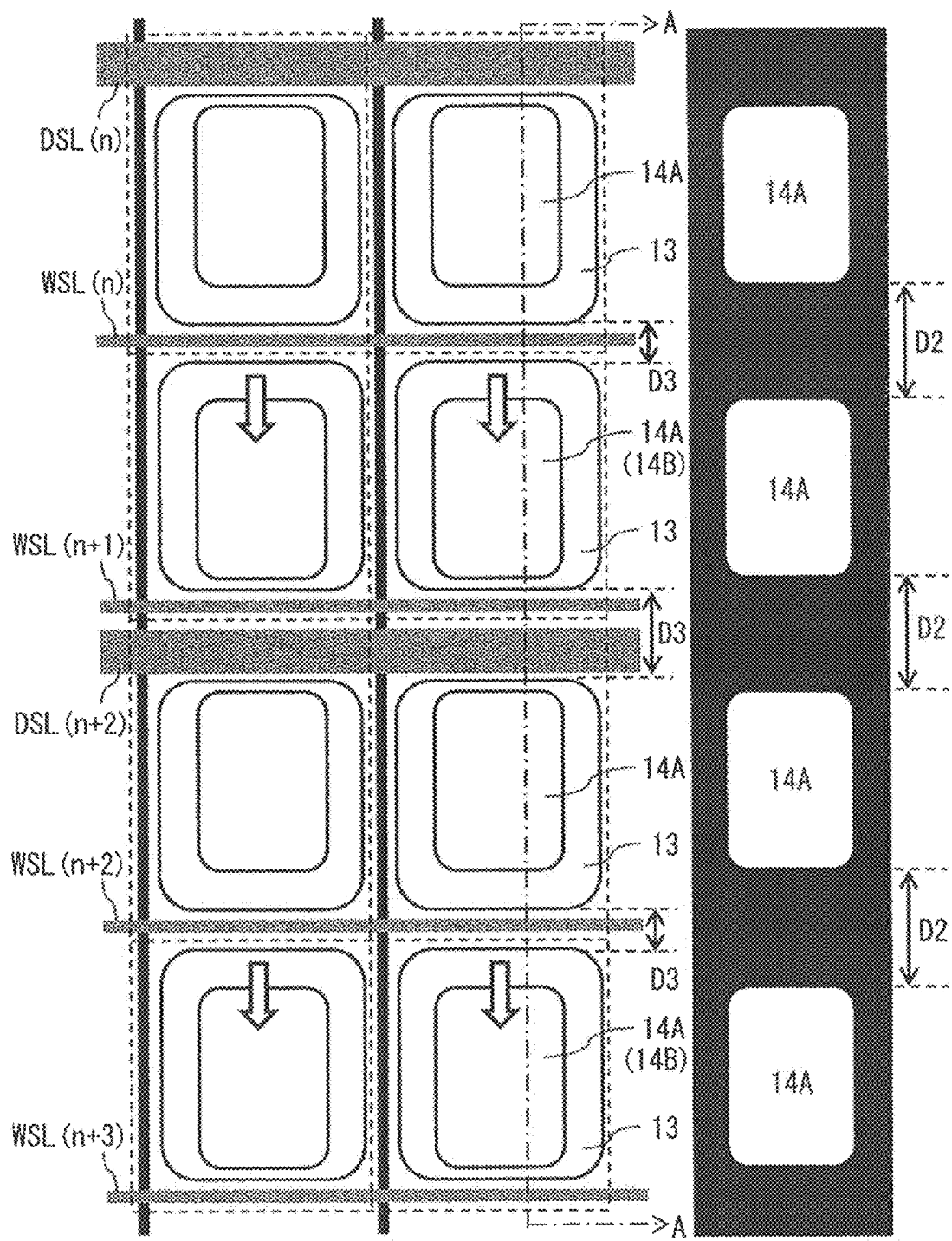
FIG. 7 is a diagram illustrating an example of a layout of the pixel array section in FIG. 1.

In contrast, according to the example embodiment of the disclosure, the spacing D3 may be relatively large at a portion facing the power line DSL, and may be relatively small at a portion facing wiring other than the power line DSL, as with the pixel array section in FIG. 6, as illustrated in FIG. 7. That is, a plurality of pixel circuits 13 may be disposed at unequal intervals in the column direction. However, according to the example embodiment of the disclosure, spacing D2 at a portion facing the power line DSL may be equal or substantially equal to the spacing D2 at a portion facing wiring other than the power line DSL. The spacing D2 is present between the plurality of light-emitting regions 14A arranged in the column direction. That is, the plurality of light-emitting regions 14A may be disposed at an equal interval in the column direction. This is because the light-emitting region 14A disposed closest to the spacing D3 corresponding to the portion where the power line DSL is omitted in FIG. 6 (light-emitting region 14B in FIG. 7) may be shifted, in a column direction, away from the spacing D3 corresponding to the portion where the power line DSL is omitted in FIG. 6, as indicated by arrows in FIG. 7.

Figure 8:
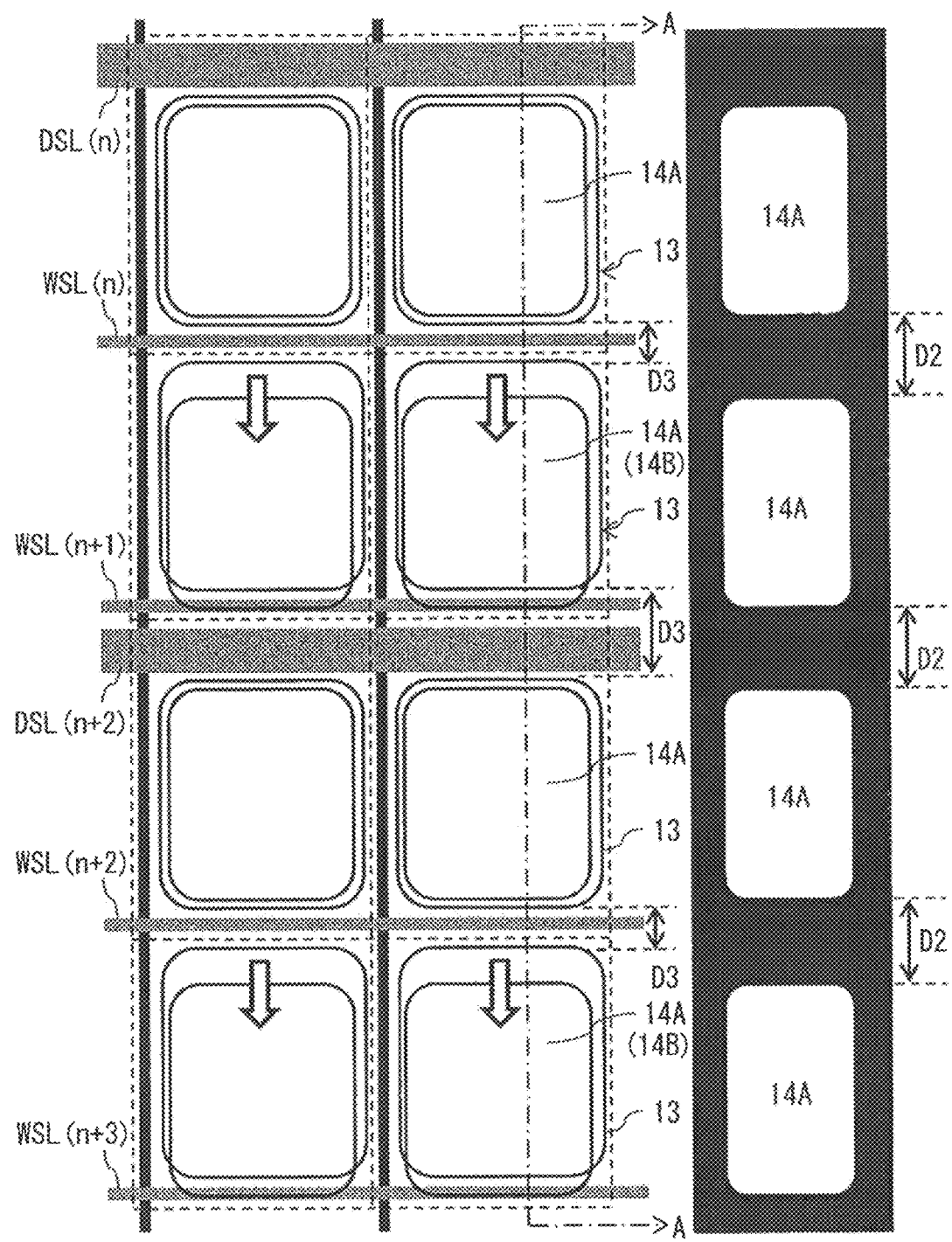
FIG. 8 is a diagram illustrating a modification example of a layout of the pixel array section in FIG. 1.

It is to be noted that the left half of FIG. 7 illustrates an example of the layout of the pixel array section 10 on a plane; and the right half of FIG. 7 illustrates the state of emission of each of the light-emitting regions 14A in the pixel array section 10 illustrated in the left half of FIG. 7. Each light-emitting region 14A may have a smaller area than the area of the pixel circuit 13 as illustrated in FIG. 7. Alternatively, each light-emitting region 14A may have an area substantially equal to the area of the pixel circuit 13 as illustrated in FIG. 8, for example. Further, each light-emitting region 14A may have a larger area than the area of the pixel circuit 13. When each light-emitting region 14A has an area substantially equal to or larger than the area of the pixel circuit 13, the light-emitting region 14B may be shifted to a position facing the scanning line WSL. It is to be noted that the left half of FIG. 8 illustrates an example of the layout of the pixel array section 10 on a plane; and the right half of FIG. 8 illustrates the state of emission of each of the light-emitting regions 14A in the pixel array section 10 illustrated in the left half of FIG. 8.

Figure 9:
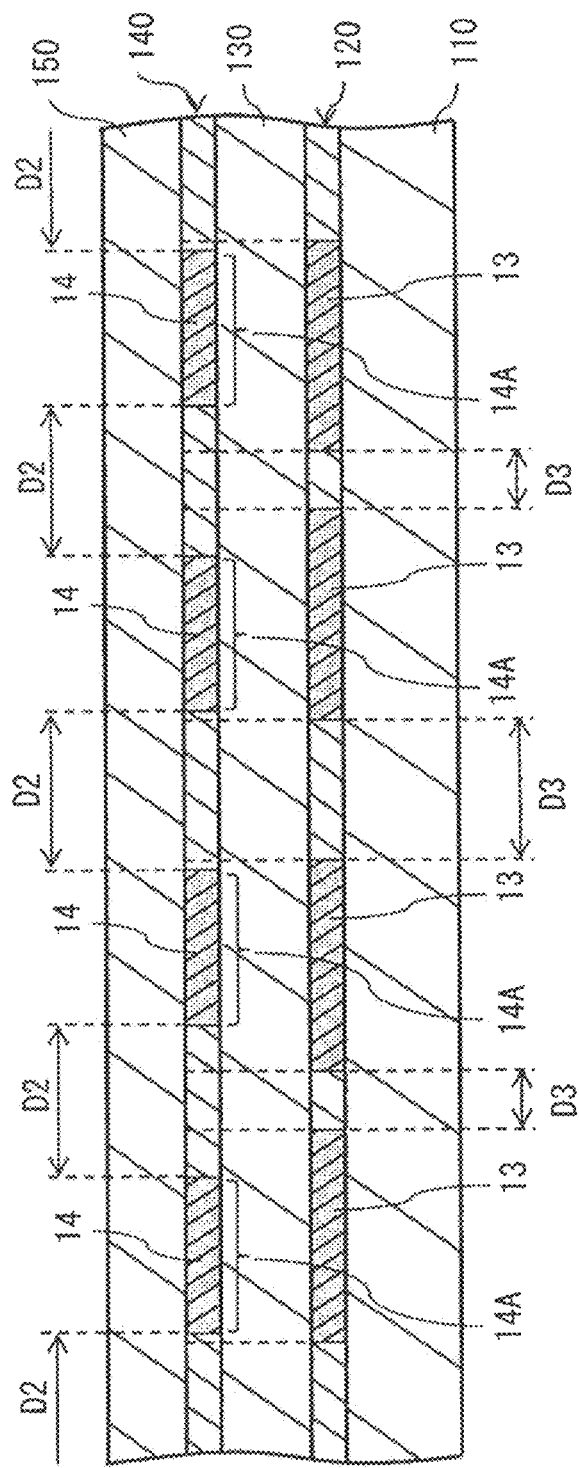
FIG. 9 is a diagram illustrating an example of a cross-sectional configuration of the pixel array section in FIG. 7.
Figure 10:
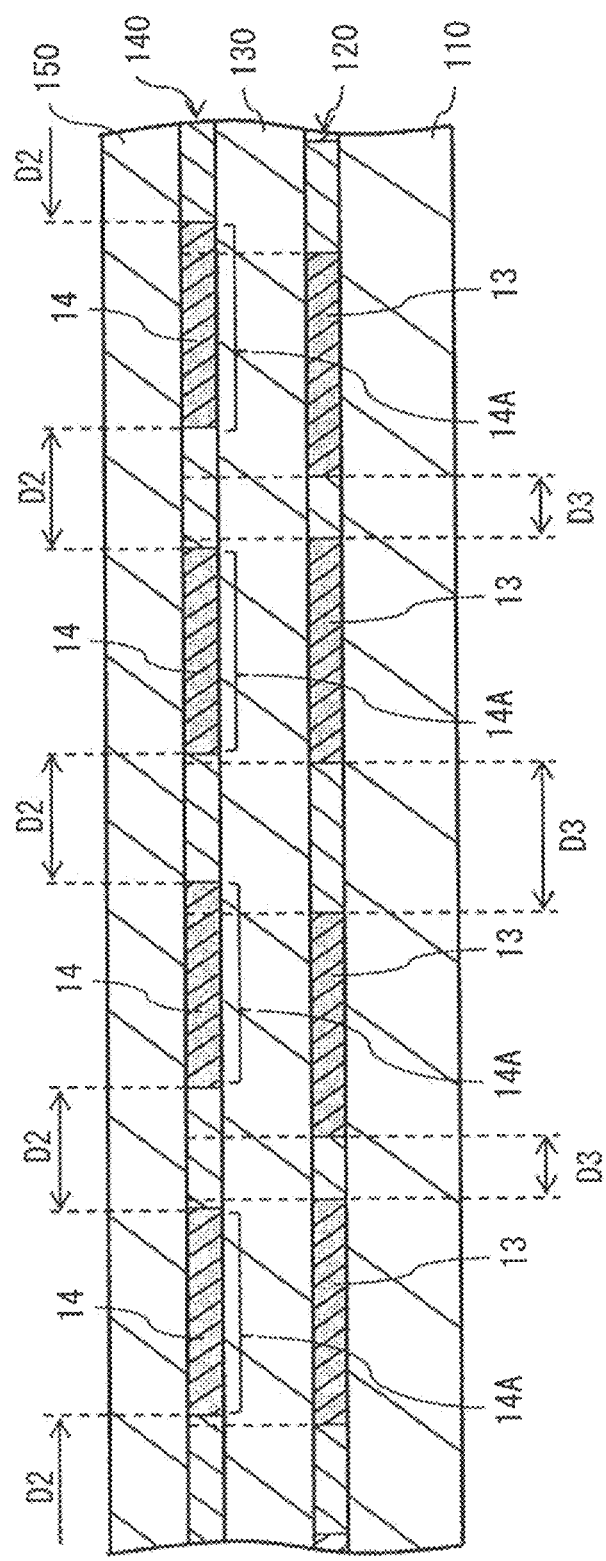
FIG. 10 is a diagram illustrating an example of a cross-sectional configuration of the pixel array section in FIG. 8.

FIG. 9 illustrates an example of a cross-sectional configuration of the pixel array section 10 in FIG. 7, along line A-A. FIG. 10 illustrates an example of a cross-sectional configuration of the pixel array section 10 in FIG. 8, along line A-A.

The display panel 40 may include a pixel circuit layer 120 on a substrate 110. The pixel circuit layer 120 may include the plurality of pixel circuits 13 disposed in a matrix. The plurality of pixel circuits 13 may be disposed at unequal intervals in the column direction. More specifically, the plurality of pixel circuits 13 may be disposed at relatively small intervals at portions facing wiring other than the power line DSL, and may be disposed at relatively large intervals at portions facing the power line DSL.

The display panel 40 may include the insulating layer 130 on the pixel circuit layer 120, and an anode layer 140 on the insulating layer 130. The anode layer 140 may include the plurality of organic EL devices 14 disposed in a matrix. The display panel 40 may include a protective layer 150 that protects the organic EL devices 14, on the anode layer 140. The organic EL devices 14 each include the light-emitting region 14A. The plurality of light-emitting regions 14A are disposed at an equal interval in the column direction. More specifically, the spacing D2 at a portion facing wiring other than the power line DSL may be equal or substantially equal to the spacing D2 at a portion facing the power line DSL. The spacing D2 is present between two light-emitting regions 14A adjacent to each other in the column direction. The plurality of organic EL devices 14 are also disposed at an equal interval in the column direction.

[Operation]

Next, operations (from extinction operation to emission operation) of the display unit 1 according to an example embodiment of the disclosure are described. The example embodiment of the disclosure may incorporate a compensation operation for the variation in I-V characteristics of the organic EL device 14, in order to keep the emission luminance of the organic EL device 14 constant without being affected by possible temporal change in the I-V characteristics of the organic EL device 14. Further, the example embodiment of the disclosure may incorporate a correction operation for the variation in a threshold voltage and mobility of the drive transistor Tr1, in order to keep the emission luminance of the organic EL device 14 constant without being affected by possible temporal change in the threshold voltage and the mobility of the drive transistor Tr1.

Figure 11:
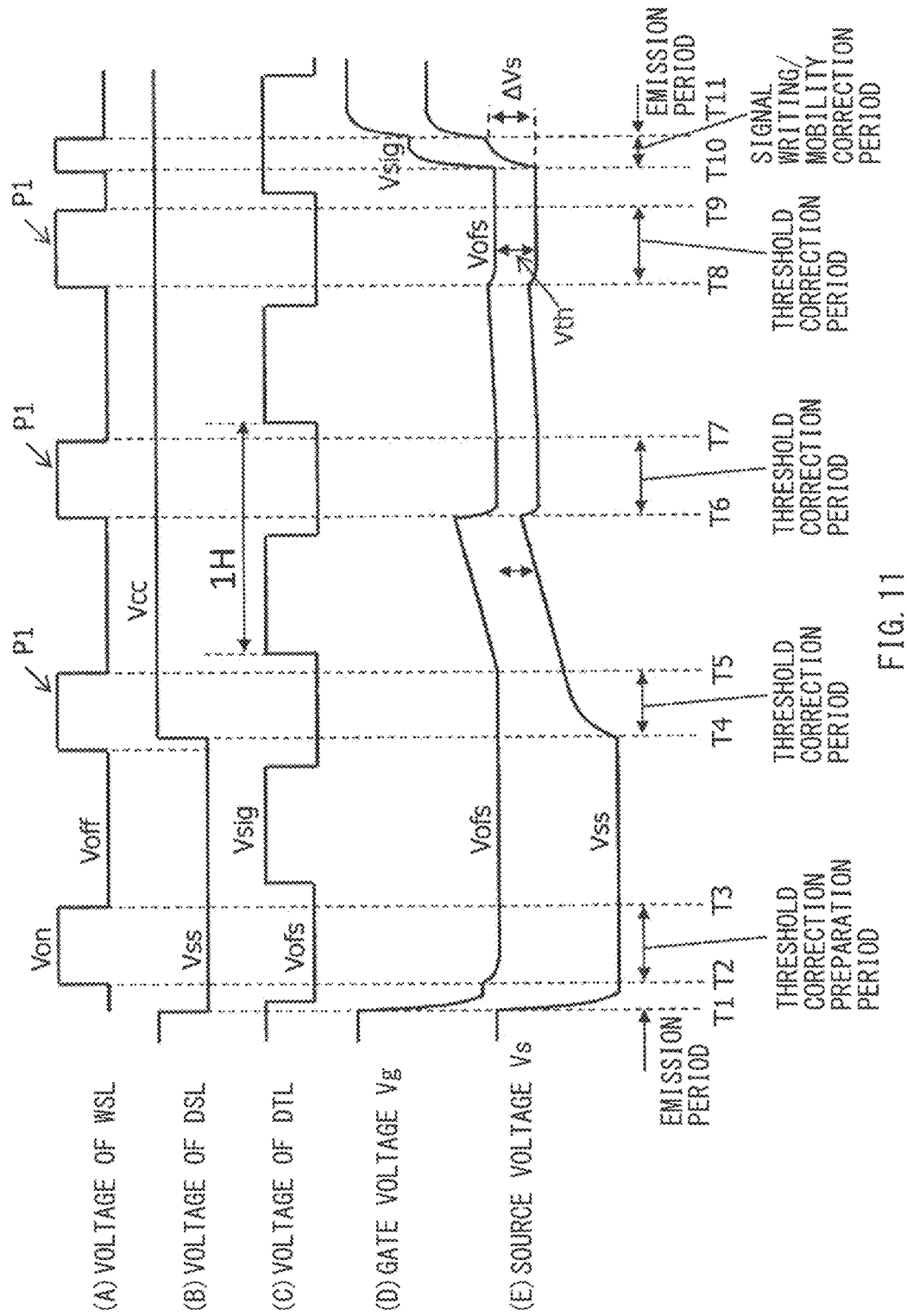
FIG. 11 is a diagram illustrating an example of signal waveforms between extinction and emission.

FIG. 11 illustrates an example of signal waveforms between extinction and emission. More specifically, FIG. 11 illustrates an example of temporal changes in voltages to be applied to the signal line DTL, the scanning line WSL and the power line DSL, and temporal changes in the gate voltage Vg and a source voltage Vs of the drive transistor Tr1, when focusing on one subpixel 12. It is to be noted that, as used hereinafter, the term "source voltage Vs" refers to the source voltage Vs of the drive transistor Tr1, unless otherwise stated specifically.

First, the controller 20 and the driver 30 may extinguish the subpixel 12. More specifically, when the voltage of the scanning line WSL is Voff; the voltage of the signal line DTL is Vsig; and the voltage of the power line DSL is Vcc (i.e., when the organic EL device 14 emits light), the power scanner 33 may decrease the voltage of the power line DSL from Vcc to Vss in response to the control signal (at time T1). This may decrease the source voltage Vs to Vss, allowing the organic EL device 14 to be extinguished. At this time, the gate voltage Vg may also be decreased due to coupling via the holding capacitor Cs.

[Correction Preparation Period]

Next, the controller 20 and the driver 30 may prepare for threshold correction. More specifically, during the times when the voltage of the power line DSL is Vss; and the voltage of the signal line DTL is Vofs, the write scanner 32 may increase the voltage of the scanning line WSL from Voff to Von in response to the control signal (at time T2). Then, the gate voltage Vg may be decreased to Vofs. At this time, the gate-source voltage Vgs may be higher than the threshold voltage Vth, thus allowing the drive transistor Tr1 to be ON. Thereafter, the write scanner 32 may decrease the voltage of the scanning line WSL from Von to Voff in response to the control signal (at time T3). This may prevent the gate voltage Vg from being changed even when the horizontal selector 31 displaces the voltage of the signal line DTL for each of the subpixels 12 included in other subpixel rows.

[Threshold Correction Period]

Next, the controller 20 and the driver 30 may perform threshold correction of the drive transistor Tr1. More specifically, during the times when the voltage of the signal line DTL is Vofs; and the voltage of the scanning line WSL is Von, the power scanner 33 may increase the voltage of the power line DSL from Vss to Vcc in response to the control signal (at time T4). Then, a current may flow between the drain and the source of the drive transistor Tr1, thus increasing the source voltage Vs. At this time, when the source voltage Vs is lower than a value of (Vofs−Vth) (i.e., when the threshold correction is not yet completed), a current may flow between the drain and the source of the drive transistor Tr1 until the drive transistor Tr1 is cut off (i.e., until the gate-source voltage Vgs is Vth). This may increase the source voltage Vs. As a result, the holding capacitor Cs may be charged to have Vth, allowing the gate-source voltage Vgs to be Vth. When the source voltage Vs does not reach the value of (Vofs−Vth) (i.e., when the threshold correction is not yet completed), during the time when the drive transistor Tr1 remains ON, the write scanner 32 may repeatedly apply a pulse P1 for threshold correction to the scanning line WSL until the drive transistor Tr1 is cut off (i.e., until the gate-source voltage Vgs is Vth) (at times T6, T7, T8, and T9).

Thereafter, the write scanner 32 may decrease the voltage of the scanning line WSL from Von to Voff in response to the control signal (at time T5) before the horizontal selector 31 switches the voltage of the signal line DTL from Vofs to Vsig in response to the control signal. Accordingly, the gate of the drive transistor Tr1 may be brought into a floating state, thus making it possible to keep the gate-source voltage Vgs at Vth irrespective of the magnitude of the voltage of the signal line DTL. Thus, setting the gate-source voltage Vgs at Vth makes it possible to suppress the dispersion of the emission luminance of the organic EL devices 14 even when the threshold voltage Vth of the drive transistor Tr1 varies for each pixel circuit 13.

[Signal Writing and Mobility Correction Period]

After completion of the threshold correction, the controller 20 and the driver 30 may perform mobility correction and writing of the signal voltage Vsig in response to the image signal Din. More specifically, during the times when the voltage of the signal line DTL is Vsig; and the voltage of the power line DSL is Vcc, the write scanner 32 may increase the voltage of the scanning line WSL from Voff to Von in response to the control signal (at time T10), and may couple the gate of the drive transistor Tr1 to the signal line DTL. Then, the gate voltage Vg of the drive transistor Tr1 may be the voltage Vsig of the signal line DTL. At this time, an anode voltage of the organic EL device 14 may be still lower than that of the threshold voltage Vel of the organic EL device 14 at this stage, causing the organic EL device 14 to be cut off. Accordingly, a current between the gate and the source may flows into a device capacitance of the organic EL device 14, allowing the device capacitance to be charged. Consequently, the source voltage Vs may be increased by ΔVs, soon allowing the gate-source voltage Vgs to be a voltage value of (Vsig+Vth−ΔVs). Thus, mobility correction may be performed together with the writing. As the mobility of the drive transistor Tr1 becomes greater, ΔVs also becomes greater; therefore, allowing the gate-source voltage Vgs to be smaller by ΔV before emission makes it possible to suppress the dispersion of the mobility for each of the subpixels 12.

[Emission]

Finally, the write scanner 32 may decrease the voltage of the scanning line WSL from Von to Voff in response to the control signal (at time T11). Accordingly, the gate of the drive transistor Tr1 may be brought into a floating state, thus allowing a current Ids to flow between the drain and the source of the drive transistor Tr1, thus increasing the source voltage Vs. As a result, a voltage equal to or higher than the threshold voltage Vel may be applied to the organic EL device 14, allowing the organic EL device 14 to emit light at desired luminance.

Next, emission control to be applied to the display panel 40 is described.

Figure 12:
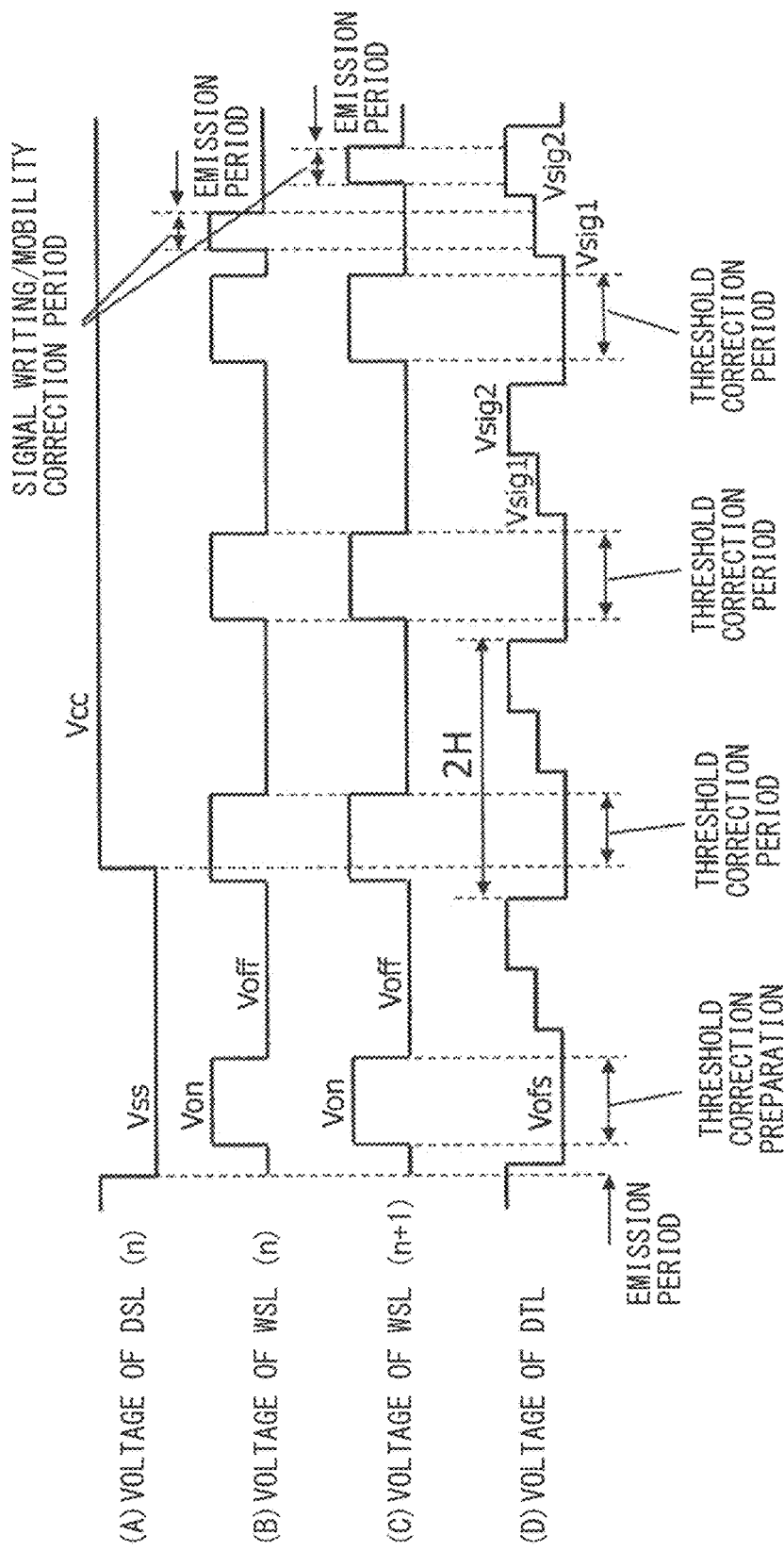
FIG. 12 is a diagram illustrating an example of emission control to be applied to a display panel.

FIG. 12 illustrates an example of emission control to be applied to the display panel 40. More specifically, FIG. 12 illustrates an example of temporal changes in the voltages to be applied to the power line DSL (n), the scanning lines WSL (n) and WSL (n+1), and the signal line DTL, when focusing on two subpixel rows sharing the power line DSL (n). The controller 20 and the driver 30 may perform preparation for threshold correction simultaneously for the two subpixel rows sharing the power line DSL (n), and thereafter may perform threshold correction simultaneously for the two subpixel rows. Thereafter, the controller 20 and the driver 30 may perform signal writing and mobility correction for each subpixel row in turn. In FIG. 12, the controller 20 and the driver 30 may perform an emission operation for a front subpixel row and an emission operation for a rear subpixel row by shifting the operations by a period of H/2 during a common 1H period. Accordingly, the horizontal selector 31 may supply a signal voltage Vsig1 corresponding to the front subpixel row and a signal voltage Vsig2 corresponding to the rear subpixel row to the signal line DTL in a manner shifted by the period of H/2 during the common 1H period. Further, in FIG. 12, the controller 20 and the driver 30 may increase the voltage of the power line DSL (n) from Vss to Vcc immediately after the start of the threshold correction for each of the subpixel rows.

Figure 13:
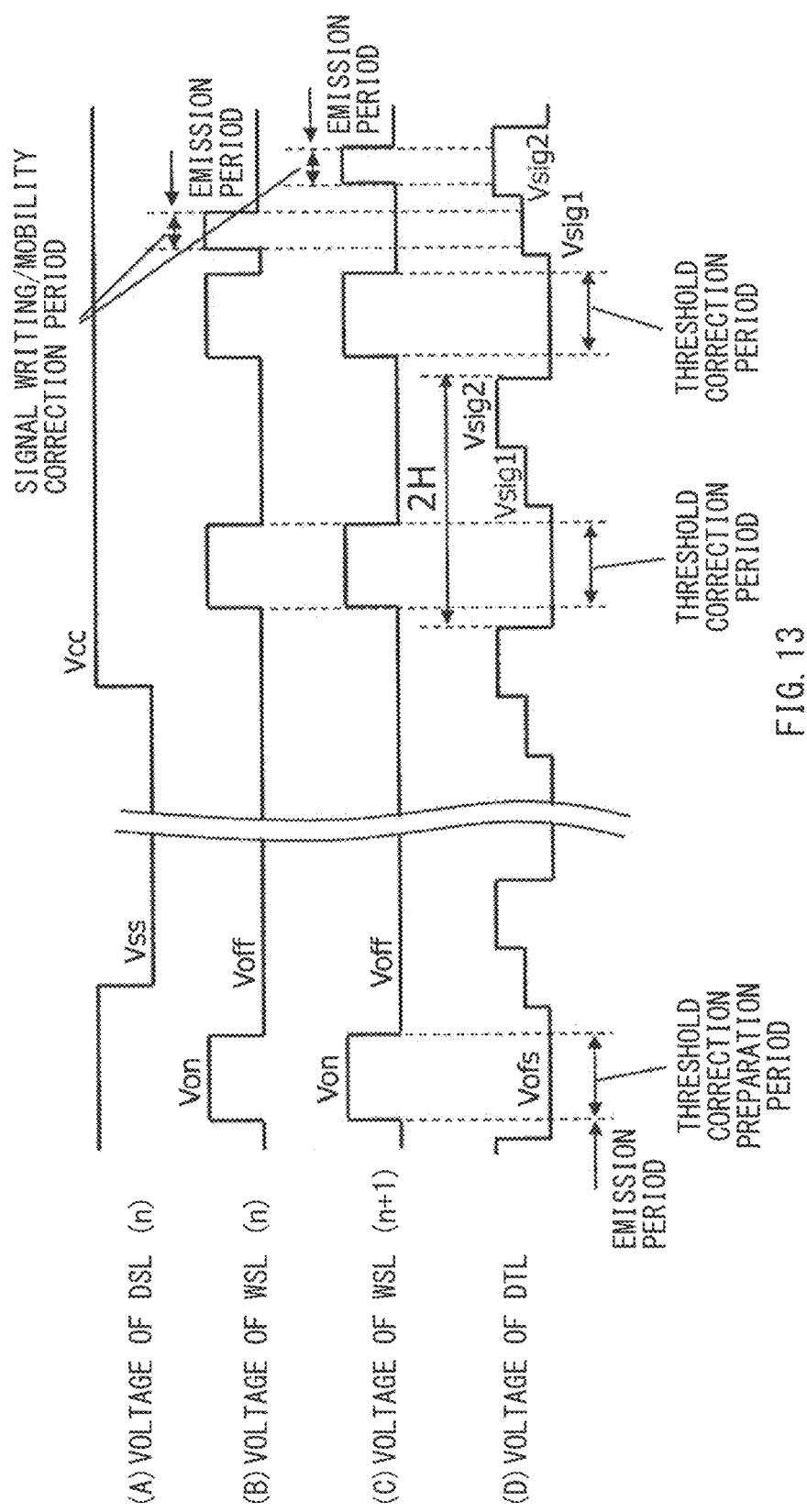
FIG. 13 is a diagram illustrating an example of emission control to be applied to a display panel.

FIG. 13 illustrates an example of emission control to be applied to the display panel 40. More specifically, FIG. 13 illustrates an example of temporal changes in the voltages to be applied to the power line DSL (n), the scanning lines WSL (n) and WSL (n+1), and the signal line DTL, when focusing on two subpixel rows sharing the power line DSL (n). The controller 20 and the driver 30 may perform the preparation for threshold correction simultaneously for the two subpixel rows sharing the power line DSL (n), and thereafter may perform threshold correction simultaneously for the two subpixel rows. Thereafter, the controller 20 and the driver 30 may perform the signal writing and mobility correction for each subpixel row in turn. In FIG. 13, the controller 20 and the driver 30 may perform an emission operation for a front subpixel row and an emission operation for a rear subpixel row by shifting the operations by a period of H/2 during a common 1H period. Accordingly, the horizontal selector 31 may supply the signal voltage Vsig1 corresponding to the front subpixel row and the signal voltage Vsig2 corresponding to the rear subpixel row to the signal line DTL in a manner shifted by the period of H/2 during the common 1H period. Further, in FIG. 13, the controller 20 and the driver 30 may perform the preparation for threshold correction for each of the subpixel rows, and thereafter may decrease the voltage of the power line DSL (n) to Vss for a predetermined period of time, before performing the threshold correction for each of the subpixel rows.

Figure 14:
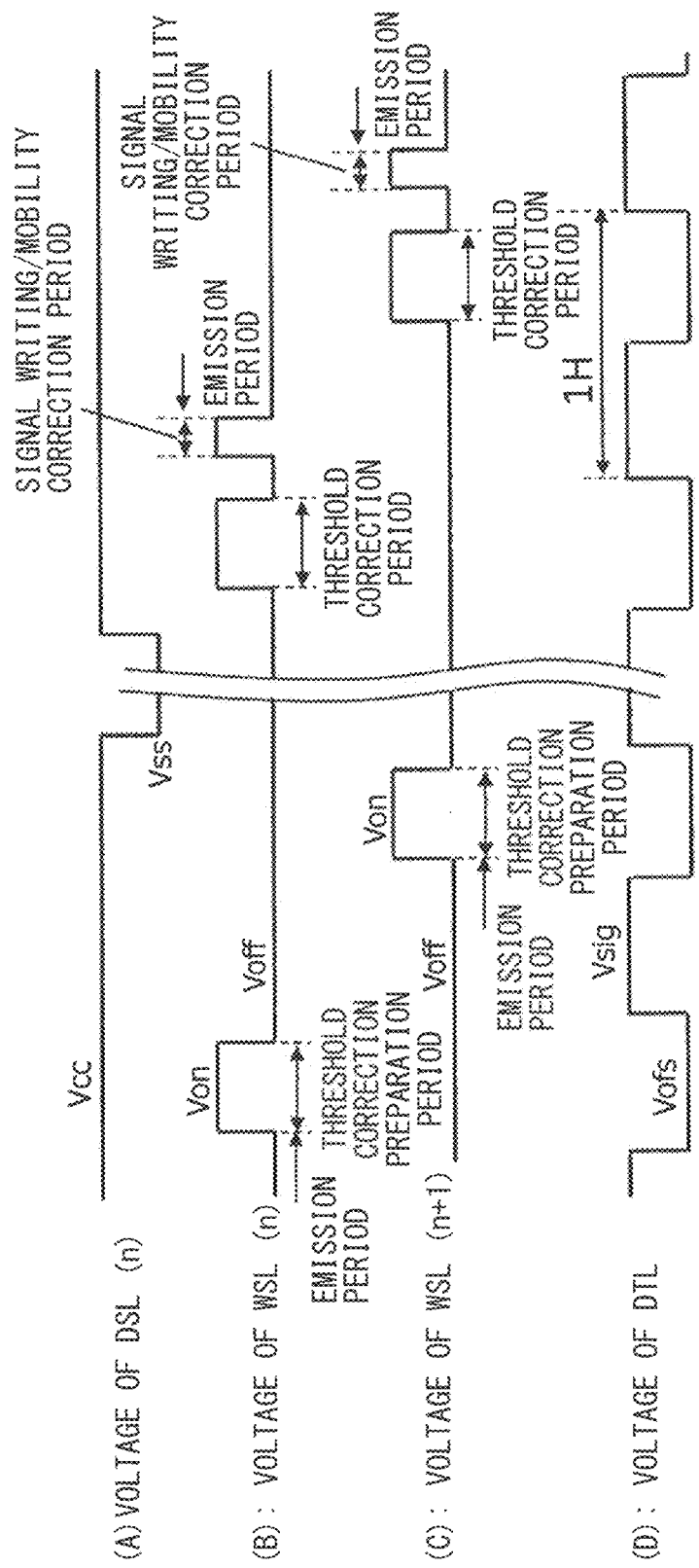
FIG. 14 is a diagram illustrating an example of emission control to be applied to a display panel.

FIG. 14 illustrates an example of emission control to be applied to the display panel 40. More specifically, FIG. 14 illustrates an example of temporal changes in the voltages to be applied to the power line DSL (n), the scanning lines WSL (n) and WSL (n+1), and the signal line DTL, when focusing on two subpixels sharing the power line DSL (n). The controller 20 and the driver 30 may perform the preparation for threshold correction for each of the two subpixel rows sharing the power line DSL (n) in turn, and thereafter may perform threshold correction, signal writing, and mobility correction for each subpixel row in turn. In FIG. 14, the controller 20 and the driver 30 may perform an emission operation for a front subpixel row and an emission operation for a rear subpixel row during different 1H periods. Accordingly, the horizontal selector 31 may supply the signal voltage Vsig corresponding to the front subpixel row and the signal voltage Vsig corresponding to the rear subpixel row to the signal line DTL during different 1H periods. Further, in FIG. 14, the controller 20 and the driver 30 may perform the preparation for threshold correction for each of the subpixel rows, and thereafter may decrease the voltage of the power line DSL (n) to Vss for a predetermined period of time, before performing the threshold correction for each of the subpixel rows.

In FIG. 12, the controller 20 and the driver 30 may increase the voltage of the power line DSL (n) from Vss to Vcc in the middle of applying Von to each of the scanning lines WSL (n) and WSL (n+1) in order to perform the threshold correction. In contrast, in FIGS. 13 and 14, the controller 20 and the driver 30 may avoid the periods for the preparation for threshold correction and for the threshold correction to increase or decrease the voltage of the power line DSL (n). Accordingly, in FIGS. 13 and 14, the influence of the fluctuation in the voltage in the power line DSL (n) on the threshold correction may be suppressed. Further, in FIG. 14, the lengths of the time periods from the end of the threshold correction to the start of the signal writing in the subpixel rows may be equal to each other. Accordingly, even in a case where a current leak occurs in each of the subpixels 12 during the time periods from the end of the threshold correction to the start of the signal writing, when the signal voltage Vsig of common gradation is applied, the occurrence of luminance unevenness caused by the current leak may be suppressed in the emission luminance of each of the subpixels 12.

[Effects]

Next, description is given of effects in the display unit 1.

[Horizontal Crosstalk]

Figure 15:
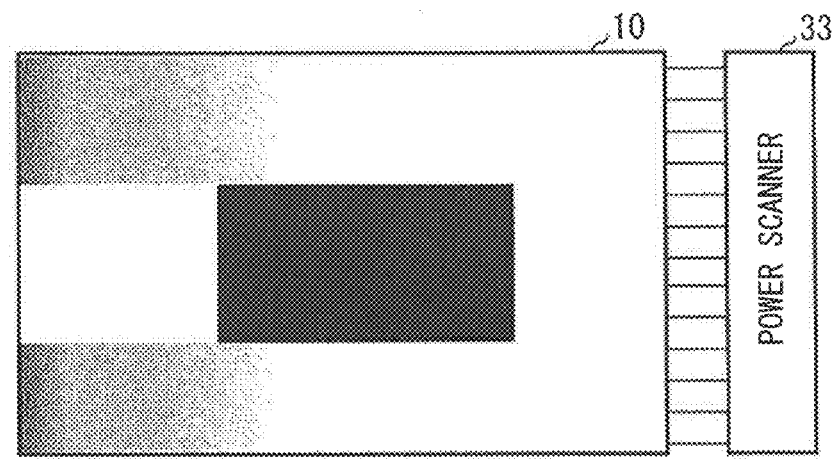
FIG. 15 is an explanatory diagram of an influence of voltage drop in each power line.

In an active matrix organic EL display unit, the organic EL devices may emit light line-sequentially. Accordingly, in a case where the total luminance (current amount) of pixels for one line varies for each line, even when the signal voltage of the same gradation is applied, there may occur a phenomenon (horizontal crosstalk) in which actual emission luminance varies for each line, disadvantageously causing deterioration in image quality. For example, as illustrated in FIG. 15, as being distant away from the power scanner 33 that supplies a voltage to the power line DSL, luminance decrease may occur due to voltage drop. At this time, when there is a region of black luminance in an image, a pixel on the left of the black region may have less amount of voltage drop than other pixels, making the luminance decrease less likely to occur. Accordingly, there may occur a large luminance difference between a region on the left of the black region and regions on the upper and lower sides of the region.

Therefore, there has been an attempt to prevent the horizontal crosstalk. However, it has been difficult to remove the horizontal crosstalk completely only by correction of the voltage drop with wiring resistance of the power line, so that a further countermeasure has been requested.

In contrast, according to the example embodiment of the disclosure, the number of the power lines DSL may be reduced, and one power line DSL may be shared by the plurality of subpixel rows. Thus, even when the total luminance (current amount) of the subpixels 12 for one line (for one subpixel row) varies for each line (subpixel row), the shared power line DSL may average the total luminance (current amount) of the pixels for one line (for one subpixel row) between the subpixel rows sharing the power line DSL. As a result, a large luminance difference as illustrated in FIG. 15 may not occur between adjacent subpixels. In this manner, it becomes possible to alleviate the horizontal crosstalk with a new technique.

[Definition]

The organic EL display unit is requested to have still higher definition which is also requested likewise for other display units. Under such circumstances, reduction in the number of power lines DSL whose wiring widths are relatively large and sharing a single power line DSL by a plurality of pixel rows are considered (see FIGS. 5 and 6).

However, when a gap that occurs as a result of the reduction of the power lines DSL is eliminated by narrowing a spacing between pixels, pixel pitches are not equal to one another on a plane. In general, when the pixel pitches are not equal to one another on a plane, definition at the time when an image is displayed is determined by a portion having the largest spacing. Accordingly, it is disadvantageous that the definition does not change considerably from definition before reducing the number of the power lines DSL.

In contrast, according to the example embodiment of the disclosure, when eliminating the gap that occurs as a result of the reduction of the power lines DSL by narrowing a spacing between pixels, the plurality of organic EL devices 14 may be provided to allow the spacing D2 between the two light-emitting regions 14A adjacent in the column direction to have an equal interval. That is, according to the example embodiment of the disclosure, as a result of the narrowed spacing D3 between the subpixels 12, the plurality of pixel circuits 13 may be disposed at unequal intervals in the column direction, whereas the spacing D2 between the two light-emitting regions 14A adjacent in the column direction may have an equal interval. This may allow the definition in the column direction to be determined by the spacing D2. Further, the spacing D2 may be smaller than the spacing D1 which is spacing before reducing the number of the power lines DSL. Accordingly, the definition in the column direction may be higher than definition before reducing the number of the power lines DSL.

In the display panel, the display unit, and the electronic apparatus according to an embodiment of the technology, a single power line is shared by the plurality of pixel rows. This makes it possible to narrow pixel pitches in the column direction compared with a case where one of a plurality of power lines is disposed for each pixel row. Further, according to an embodiment of the technology, the plurality of pixel circuits are provided such that a spacing between the plurality of pixel circuits in the column direction is relatively large at a portion facing the power lines and is relatively small at a portion facing wiring other than the power lines. Meanwhile, the plurality of light-emitting devices are provided to allow light-emitting regions of the respective light-emitting devices to have an equal interval in the column direction. This allows definition in the column direction to be determined by the interval between the light-emitting regions of the respective light-emitting devices in the column direction. Further, it is possible to reduce the interval between the light-emitting regions of the respective light-emitting devices in the column direction compared with a case where one of the plurality of power lines is provided for each pixel row.

According to the display panel, the display unit, and the electronic apparatus of an embodiment of the technology, it is possible to achieve a high-definition display panel, because a single power line is shared by the plurality of pixel rows, and the plurality of light-emitting devices are provided to allow light-emitting regions of the respective light-emitting devices to have an equal interval in the column direction. It is to be noted that the foregoing technical contents are mere examples. The effects according to an embodiment of the technology are not limited to those described hereinabove. The technology may have effects different from those described above, or may further have other effects in addition to those described above.

2. Modification Example

Hereinafter, a modification example of the display unit 1 is described. It is to be noted that the same numerals are assigned to components common to those of the display unit 1 of the foregoing example embodiment. Further, descriptions therefor are omitted where appropriate.

Modification Example A

In the foregoing example embodiment, the position of the light-emitting region 14A may be adjustable only by adjusting the position of an opening of an insulating layer 40A as illustrated in FIG. 4, for example. Accordingly, according to the example embodiment of the disclosure, it is possible to shift only the position of the light-emitting region 14A in the column direction, while allowing the positional relationship on a plane between the organic EL device 14 (specifically, the electrode layer 14a or the organic layer 14b) and the pixel circuit 13 (positioned to face the organic EL device 14) to be the same in the overall pixel array section 10.

In this case, the plurality of pixel circuits 13 may be disposed at unequal intervals in the column direction, and each of the organic EL devices 14 (specifically, each of the electrode layers 14a or each of the organic layers 14b) may be disposed at a common position with respect to the pixel circuit 13 immediately below. That is, the plurality of organic EL devices 14 may be disposed at unequal intervals in the column direction in the same manner as the plurality of pixel circuits 13. Further, the plurality of light-emitting regions 14A may be disposed at an equal interval in the column direction.

Modification Example B

Figure 16:
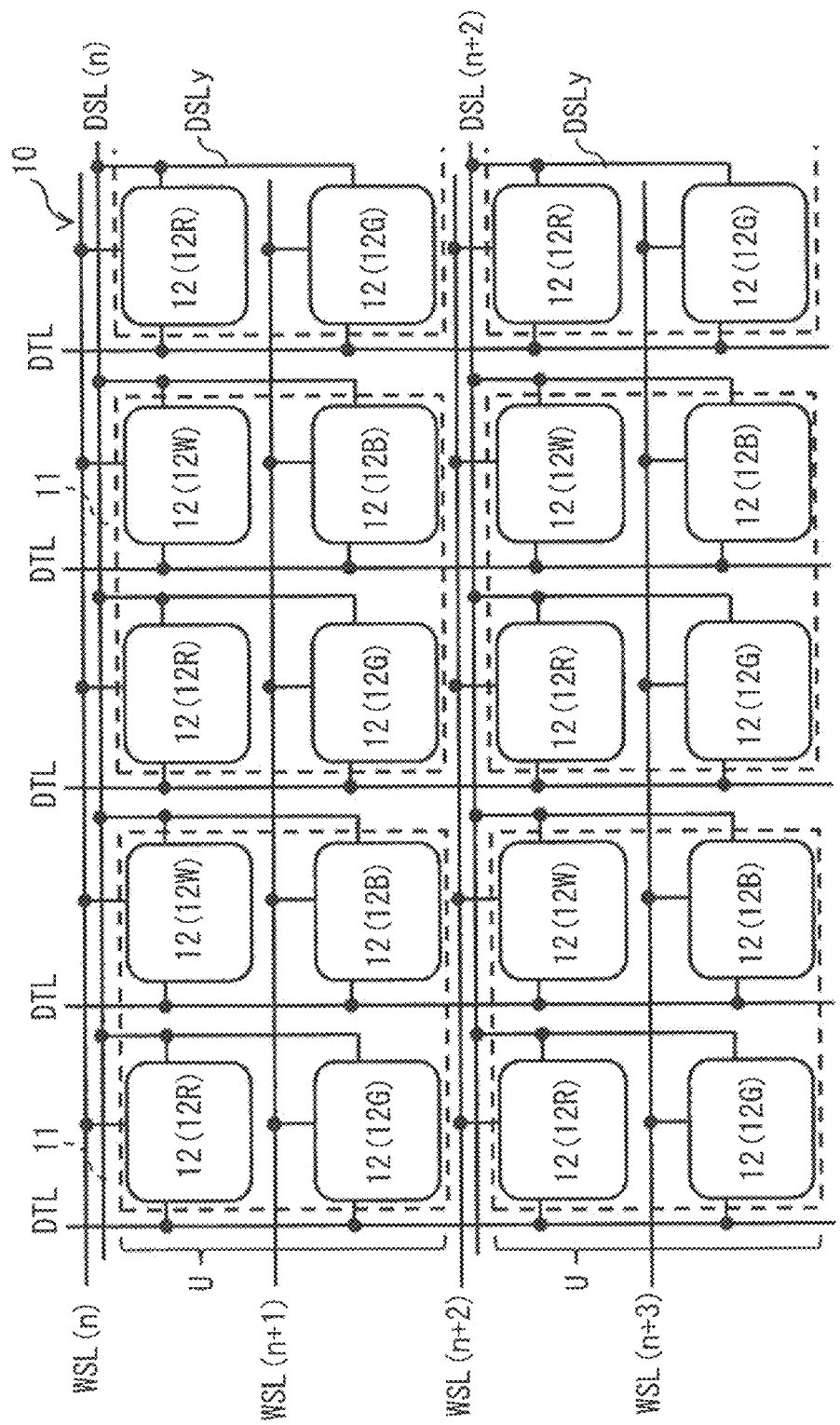
FIG. 16 is a diagram illustrating a modification example of the circuit configuration of the pixel array section in FIG. 2.

FIG. 16 illustrates a modification example of a circuit configuration of the pixel array section 10 in FIG. 2. According to the example embodiment of the disclosure, each of the display pixels 11 may include the plurality of subpixels 12 disposed in a matrix of two by two or more. The subpixel 12 may correspond to a specific but non-limiting example of "pixel" of an embodiment of the technology. Further, each of the subpixels 12 may correspond to a specific but non-limiting example of "the subpixels included in a display pixel including the plurality of subpixels disposed in a matrix of two by two or more" of an embodiment of the technology.

According to the modification example of the disclosure, each of the display pixels 11 may include four subpixels 12 disposed in two-by-two matrix, as illustrated in FIG. 16, for example. In each of the display pixels 11, four subpixels 12 may include subpixels 12R, 12G, 12B, and 12W, for example.

One scanning line WSL may be assigned to each subpixel row. Each of the scanning lines WSL may be coupled to each of the subpixels 12 included in the assigned subpixel row. Each one of the plurality of scanning lines WSL may be disposed for each spacing between subpixels 12 adjacent to each other in the column direction. It is to be noted that, in FIG. 16, the scanning line WSL corresponding to the n-th subpixel row is expressed as the scanning line WSL (n). Likewise, the scanning line WSL corresponding to the n+1-th subpixel row is expressed as a scanning line WSL (n+1); the scanning line WSL corresponding to the n+2-th subpixel row is expressed as a scanning line WSL (n+2); and the scanning line WSL corresponding to the n+3-th subpixel row is expressed as a scanning line WSL (n+3).

One power line DSL may be assigned to each pixel row. That is, each one of the plurality of power lines DSL may be disposed for the plurality of subpixel rows included in the pixel row. Each of the power lines DSL may be coupled to each of the subpixels 12 included in the assigned one pixel row. Each of the power lines DSL may include a plurality of branch lines DSLy, each one of which is assigned to a corresponding subpixel column. Each of the branch lines DSLy may be coupled to the plurality of subpixels 12 arranged in the column direction, included in the pixel row. When a band-shaped region including the plurality of subpixel rows assigned to each of the power lines DSL is expressed as the unit U, one of the plurality of power lines DSL may be disposed for each spacing between the two units U adjacent to each other. It is to be noted that, in FIG. 16, the power line DSL corresponding to the n-th and the n+1-th subpixel rows is expressed as the power line DSL (n). Likewise, the power line DSL corresponding to the n+2-th and the n+3-th subpixel rows is expressed as the power line DSL (n+2).

One signal line DTL may be assigned to each subpixel column. Each of the signal lines DTL may be coupled to each of the subpixels 12 included in the assigned subpixel column.

According to the modification example of the disclosure, the number of the power lines DSL may be reduced, and one power line DSL may be shared by the plurality of subpixel rows. Accordingly, as with the foregoing example embodiment, there may occur no large luminance difference as illustrated in FIG. 15, between the adjacent subpixels. Thus, it is possible to alleviate the horizontal crosstalk with a new technique.

Further, according to the modification example of the disclosure, as with the foregoing example embodiment, when eliminating the gap that occurs as a result of the reduction of the power lines DSL by narrowing a spacing between pixels, the plurality of organic EL devices 14 may be provided to allow the spacing D2 between the two light-emitting regions 14A adjacent in the column direction to have an equal interval. That is, according to the modification example of the disclosure, as a result of the narrowed spacing D3 between the subpixels 12, the plurality of pixel circuits 13 may be disposed at unequal intervals in the column direction, whereas the spacing D2 between the two light-emitting regions 14A adjacent in the column direction may have an equal interval. This may allow the definition in the column direction to be determined by the spacing D2. Further, the spacing D2 may be smaller than the spacing D1 which is a spacing before reducing the number of the power lines DSL. Accordingly, the definition in the column direction may be higher than definition before reducing the number of the power lines DSL.

Modification Example C

Figure 17:
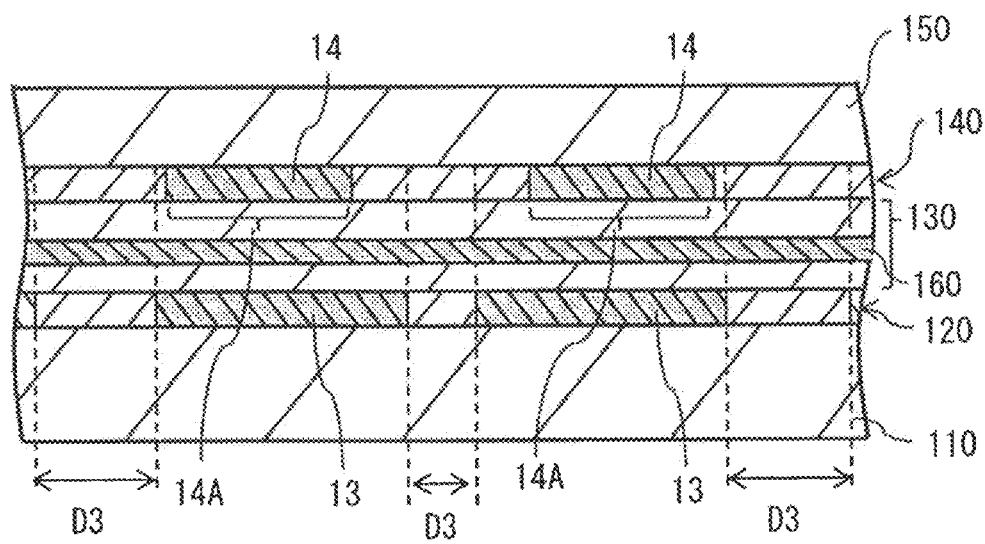
FIG. 17 is a diagram illustrating a modification example of the cross-sectional configuration of the pixel array section in FIG. 9.
Figure 18:
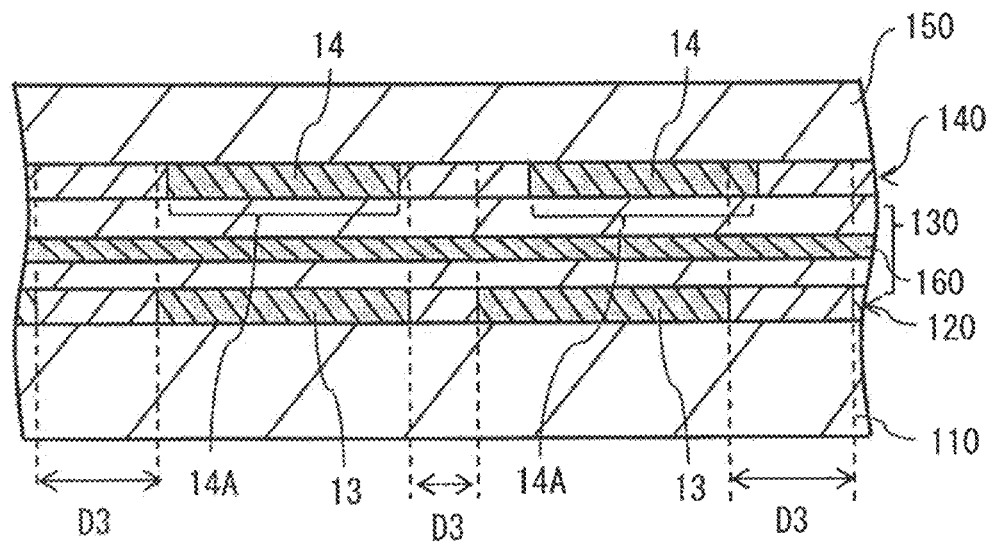
FIG. 18 is a diagram illustrating a modification example of the cross-sectional configuration of the pixel array section in FIG. 10.

FIG. 17 illustrates a modification example of the cross-sectional configuration of the pixel array section 10 in FIG. 9. FIG. 18 illustrates a modification example of the cross-sectional configuration of the pixel array section 10 in FIG. 10. According to the foregoing example embodiment and the modification example thereof, the display panel 40 may include a shielding layer 160 between the pixel circuit 13 and the organic EL device 14.

The shielding layer 160 may be provided in a sheet-like manner throughout the pixel array section 10, or may be provided partially only in a region at which the pixel circuit 13 and the organic EL device 14 face each other, for example. The shielding layer 160 may prevent coupling between the pixel circuit 13 and the organic EL device 14, and may be made of an electrically conductive material. The shielding layer 160 may be preferably coupled to the power circuit 23; for example, the shielding layer 160 may preferably have a fixed voltage due to a voltage applied by the power circuit 23.

When the position of the organic EL device 14 relative to the pixel circuit 13 is not equal in every subpixel 12, coupling with a magnitude in accordance with the position of the organic EL device 14 relative to the pixel circuit 13 may occur between the organic EL device 14 and the pixel circuit 13. When the magnitude of the coupling occurring between the organic EL device 14 and the pixel circuit 13 varies for each of the subpixels 12, there is a possibility that the coupling may cause poor image quality.

However, according to the modification example of the disclosure, the shielding layer 160 may be provided between the pixel circuit 13 and the organic EL device 14, thus making it possible to suppress the occurrence of poor image quality caused by the coupling.

Modification Example D

Figure 19:
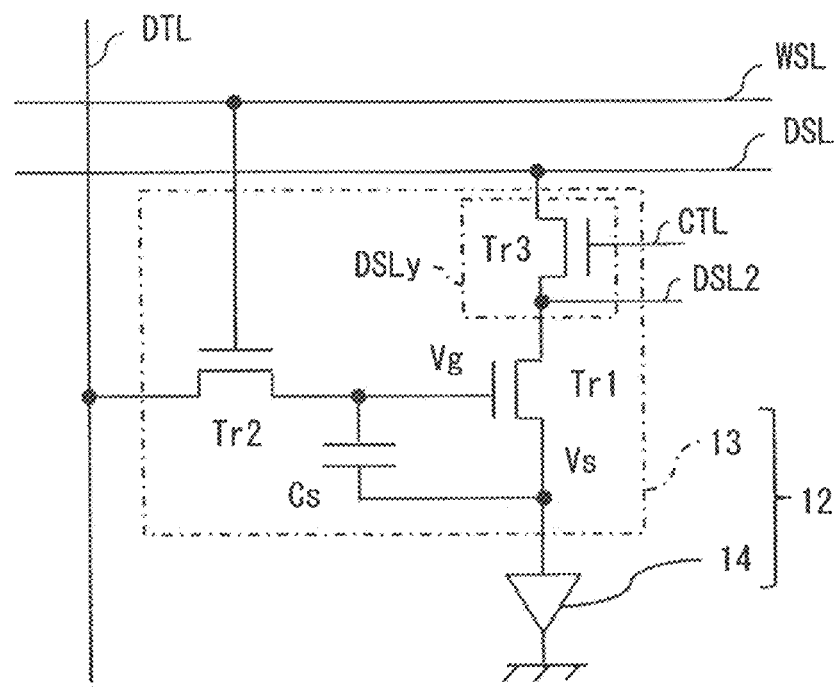
FIG. 19 is a diagram illustrating a modification example of the circuit configuration of each of the subpixels.

FIG. 19 illustrates a modification example of the circuit configuration of the subpixel 12 in FIG. 3. In the foregoing modification example C, the pixel circuit 13 in each of the subpixels 12 may further include a transistor Tr3 and wiring DSL2. The transistor Tr3 may be provided between the drive transistor Tr1 and the power line DSL, and may be coupled in series to the drive transistor Tr1. The wiring DSL2 may be coupled to a connection point between the drive transistor Tr1 and the transistor Tr3. The wiring DSL2 may allow a current to flow from the power circuit 23 and may have a voltage of Vcc when the transistor Tr3 is in an ON state. The wiring DSL2 may have a voltage of Vss when the transistor Tr3 is in an OFF state.

The transistor Tr3 may be provided in the branch line DSLy. Further, the wiring DSL2 may also be coupled to the branch line DSLy. Accordingly, the transistor Tr3 and the wiring DSL2 may be shared by the respective subpixels 12 coupled to the common power line DSL.

According to the modification example of the disclosure, the transistor Tr3 and the wiring DSL2 may be shared by the respective subpixels 12 coupled to the common power line DSL. In this case, when the shielding layer 160 is provided between the branch line DSLy (specifically, the transistor Tr3 and the wiring DSL2) and the organic EL device 14, it becomes possible to suppress the occurrence of poor image quality caused by coupling between the branch line DSLy (specifically, the transistor Tr3 and the wiring DSL2) and the organic EL device 14.

3. Application Example

Hereinafter, an application example of the display unit 1 described in any one of the foregoing example embodiment and modification examples thereof (hereinafter, referred to as "the foregoing example embodiment, etc.") are described. It is possible to apply the display unit 1 of the foregoing example embodiment, etc. to a display unit of an electronic apparatus in various fields, which may display an image signal supplied from the outside or an image signal generated inside, as an image or as a picture. Non-limiting examples of the electronic apparatus with such display unit may include a television, a digital camera, a laptop personal computer, a portable terminal unit such as a mobile phone, and a video camera.

Figure 20:
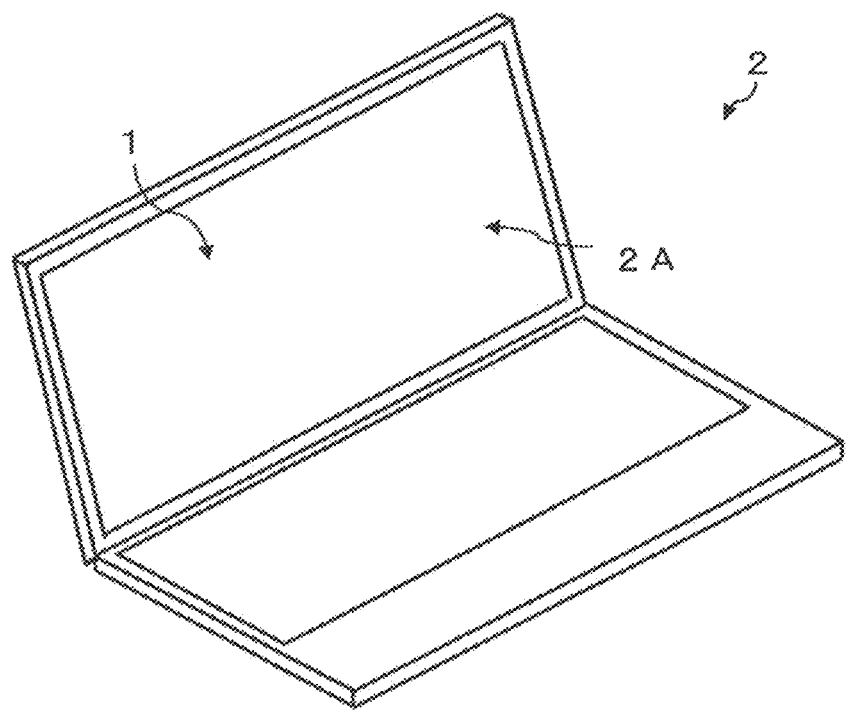
FIG. 20 is a perspective view of an outer appearance of an application example of the display unit according to any one of the example embodiments and the modification examples.

FIG. 20 illustrates a schematic configuration example of an electronic apparatus 2 according to an application example of the disclosure. The electronic apparatus 2 may be a laptop foldable personal computer including a display surface 2A on a main surface of one of two plate-shaped casings, for example. The electronic apparatus 2 may include the display unit 1 according to the foregoing example embodiment, etc., as well as the pixel array section 10 at a location of the display surface 2A, for example. Since the display unit 1 is provided in the application example of the disclosure, it is possible to obtain a high-definition image in which poor image quality is improved.

Although the technology has been described hereinabove by way of example with reference to the example embodiments, the modification examples, and the application examples, the technology is not limited thereto but may be modified in a wide variety of ways. Moreover, the effects described hereinabove are mere examples. The effects according to an embodiment of the technology are not limited to those described hereinabove. The technology may further include other effects in addition to the effects described hereinabove.

It is possible to achieve at least the following configurations from the foregoing example embodiments and the modification examples of the technology.

(1) A display panel including:
a plurality of pixels that are disposed in a matrix and include respective light-emitting devices and respective pixel circuits, the pixel circuits being disposed at unequal intervals in a column direction, the light-emitting devices being provided to allow light-emitting regions of the respective light-emitting devices to have an equal interval in the column direction; and
a plurality of power lines that are extended in a row direction and each supply a current that flows into the light-emitting device, and each one of the plurality of power lines being disposed for a plurality of pixel rows, wherein
a spacing between the pixel circuits in the column direction is relatively large at a portion facing one of the power lines, and a spacing between the pixel circuits in the column direction is relatively small at a portion facing wiring other than the power lines.

(2) The display panel according to (1), wherein
each of the pixels is one of a plurality of subpixels disposed side by side in the row direction, the subpixels being included in a display pixel, and
each one of the plurality of power lines is disposed for a plurality of subpixel rows.

(3) The display panel according to (1), wherein
each of the pixels is one of a plurality of subpixels disposed in a matrix of two by two or more, the subpixels being included in a display pixel, and
each one of the plurality of power lines is disposed for a plurality of subpixel rows included in a display pixel row.

(4) The display panel according to any one of (1) to (3), wherein the plurality of light-emitting devices are disposed at an equal interval in the column direction.

(5) The display panel according to any one of (1) to (3), wherein the plurality of light-emitting devices are disposed at unequal intervals in the column direction.

(6) The display panel according to any one of (1) to (5), further including a shielding layer between the light-emitting device and the pixel circuit, the shielding layer preventing the light-emitting device and the pixel circuit from being coupled with each other.

(7) A display unit provided with a display panel and a drive circuit that drives the display panel, the display panel including:
a plurality of pixels that are disposed in a matrix and include respective light-emitting devices and respective pixel circuits, the pixel circuits being disposed at unequal intervals in a column direction, the light-emitting devices being provided to allow light-emitting regions of the respective light-emitting devices to have an equal interval in the column direction; and a plurality of power lines that are extended in a row direction and each supply a current that flows into the light-emitting device, and each one of the plurality of power lines being disposed for a plurality of pixel rows, wherein a spacing between the pixel circuits in the column direction is relatively large at a portion facing one of the power lines, and a spacing between the pixel circuits in the column direction is relatively small at a portion facing wiring other than the power lines.

(8) An electronic apparatus provided with a display unit, the display unit including a display panel and a drive circuit that drives the display panel, the display panel including:

a plurality of pixels that are disposed in a matrix and include respective light-emitting devices and respective pixel circuits, the pixel circuits being disposed at unequal intervals in a column direction, the light-emitting devices being provided to allow light-emitting regions of the respective light-emitting devices to have an equal interval in the column direction; and a plurality of power lines that are extended in a row direction and each supply a current that flows into the light-emitting device, and each one of the plurality of power lines being disposed for a plurality of pixel rows, wherein a spacing between the pixel circuits in the column direction is relatively large at a portion facing one of the power lines, and a spacing between the pixel circuits in the column direction is relatively small at a portion facing wiring other than the power lines.

Although the technology has been described in terms of exemplary embodiments, it is not limited thereto. It should be appreciated that variations may be made in the described embodiments by persons skilled in the art without departing from the scope of the technology as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably", "preferred" or the like is non-exclusive and means "preferably", but not limited to. The use of the terms first, second, etc. do not denote any order or importance, but rather the terms first, second, etc. are used to distinguish one element from another. The term "substantially" and its variations are defined as being largely but not necessarily wholly what is specified as understood by one of ordinary skill in the art. The term "about" or "approximately" as used herein can allow for a degree of variability in a value or range. Moreover, no element or component in this disclosure is intended to be dedicated to the public regardless of whether the element or component is explicitly recited in the following claims.

What is claimed is:

1. A display panel comprising:
   a plurality of pixels that are disposed in a matrix and include respective light-emitting devices and respective pixel circuits, the pixel circuits being disposed at unequal intervals in a column direction, the light-emitting devices being provided to allow light-emitting regions of the respective light-emitting devices to have an equal interval in the column direction; and
   a plurality of power lines that are extended in a row direction and each supply a current that flows into the light-emitting device, and each one of the plurality of power lines being disposed for a plurality of pixel rows, wherein
   a spacing between the pixel circuits in the column direction is relatively large at a portion facing one of the power lines, and a spacing between the pixel circuits in the column direction is relatively small at a portion facing wiring other than the power lines.

2. The display panel according to claim 1, wherein
   each of the pixels is one of a plurality of subpixels disposed side by side in the row direction, the subpixels being included in a display pixel, and
   each one of the plurality of power lines is disposed for a plurality of subpixel rows.

3. The display panel according to claim 1, wherein
   each of the pixels is one of a plurality of subpixels disposed in a matrix of two by two or more, the subpixels being included in a display pixel, and
   each one of the plurality of power lines is disposed for a plurality of subpixel rows included in a display pixel row.

4. The display panel according to claim 1, wherein the plurality of light-emitting devices are disposed at an equal interval in the column direction.

5. The display panel according to claim 1, wherein the plurality of light-emitting devices are disposed at unequal intervals in the column direction.

6. The display panel according to claim 1, further comprising a shielding layer between the light-emitting device and the pixel circuit, the shielding layer preventing the light-emitting device and the pixel circuit from being coupled with each other.

7. A display unit provided with a display panel and a drive circuit that drives the display panel, the display panel comprising:
   a plurality of pixels that are disposed in a matrix and include respective light-emitting devices and respective pixel circuits, the pixel circuits being disposed at unequal intervals in a column direction, the light-emitting devices being provided to allow light-emitting regions of the respective light-emitting devices to have an equal interval in the column direction; and
   a plurality of power lines that are extended in a row direction and each supply a current that flows into the light-emitting device, and each one of the plurality of power lines being disposed for a plurality of pixel rows, wherein
   a spacing between the pixel circuits in the column direction is relatively large at a portion facing one of the power lines, and a spacing between the pixel circuits in the column direction is relatively small at a portion facing wiring other than the power lines.

8. An electronic apparatus provided with a display unit, the display unit including a display panel and a drive circuit that drives the display panel, the display panel comprising:
   a plurality of pixels that are disposed in a matrix and include respective light-emitting devices and respective pixel circuits, the pixel circuits being disposed at unequal intervals in a column direction, the light-emitting devices being provided to allow light-emitting regions of the respective light-emitting devices to have an equal interval in the column direction; and
   a plurality of power lines that are extended in a row direction and each supply a current that flows into the light-emitting device, and each one of the plurality of power lines being disposed for a plurality of pixel rows, wherein a spacing between the pixel circuits in the column direction is relatively large at a portion facing one of the power lines, and a spacing between the pixel circuits in the column direction is relatively small at a portion facing wiring other than the power lines.

* * * * *